United States Patent
Bito

(10) Patent No.: US 10,330,764 B2
(45) Date of Patent: Jun. 25, 2019

(54) MAGNETIC RESONANCE MEASURING APPARATUS AND IMAGE PROCESSING METHOD

(71) Applicant: HITACHI, LTD., Tokyo (JP)

(72) Inventor: Yoshitaka Bito, Tokyo (JP)

(73) Assignee: HITACHI, LTD., Tokyo (JP)

( * ) Notice: Subject to any disclaimer, the term of this patent is extended or adjusted under 35 U.S.C. 154(b) by 366 days.

(21) Appl. No.: 15/287,114

(22) Filed: Oct. 6, 2016

(65) Prior Publication Data
US 2018/0059202 A1 Mar. 1, 2018

(30) Foreign Application Priority Data
Aug. 31, 2016 (JP) ................ 2016-169508

(51) Int. Cl.
*G01V 3/00* (2006.01)
*G01R 33/565* (2006.01)
*G01R 33/46* (2006.01)

(52) U.S. Cl.
CPC ... *G01R 33/56509* (2013.01); *G01R 33/4625* (2013.01)

(58) Field of Classification Search
CPC ................................ G01R 33/56509
USPC ........................... 324/309, 307, 306
See application file for complete search history.

(56) References Cited

U.S. PATENT DOCUMENTS

| | | | | |
|---|---|---|---|---|
| 4,724,386 A * | 2/1988 | Haacke | ................. | G01N 24/08 324/309 |
| 4,937,526 A * | 6/1990 | Ehman | ................ | G01R 33/5676 324/306 |
| 6,617,850 B2 * | 9/2003 | Welch | .............. | G01R 33/56509 324/307 |

* cited by examiner

*Primary Examiner* — Louis M Arana
(74) *Attorney, Agent, or Firm* — Cooper & Dunham LLP

(57) ABSTRACT

Provided is a magnetic resonance measuring apparatus that records measurement data measured by MRS or the like and a periodic motion of the measurement object during the measurement of the measurement data in association with each other, and classifies spectra calculated from the measurement data in accordance with a time phase of the periodic motion. Created spectra are integrated for each classification to thereby create partially integrated spectra, correction based on a relationship between the periodic motion and a phase fluctuation or a frequency fluctuation is performed on the partially integrated spectra, and the corrected partially integrated spectra are synthesized.

15 Claims, 20 Drawing Sheets

MAGNETIC RESONANCE MEASURING APPARATUS AND IMAGE PROCESSING METHOD

BACKGROUND OF THE INVENTION

Field of the Invention

The present invention relates to a magnetic resonance measuring apparatus and an image processing method using data obtained by the measuring apparatus.

Background Art

Magnetic resonance imaging (hereinafter, referred to as "MRI") which is becoming widespread at present is used to acquire an image on which density distribution of hydrogen atomic nuclei, which are mainly included in water molecules of an object, is reflected.

With respect to MRI, there is a method called magnetic resonance spectroscopy (MRS) in which a magnetic resonance signal for each molecule chemically bonded is separated by using a difference in resonance frequency (hereinafter, referred to as chemical shift) due to a difference in chemical bonding between various molecules including hydrogen atomic nuclei, as a key. In addition, a method of simultaneously acquiring spectra in a large number of regions (pixels) and performing imaging for each molecule is called magnetic resonance spectroscopic imaging (MRSI) or chemical shift imaging.

It is possible to visually capture concentration distribution for each metabolite by using MRSI. Meanwhile, MRS and MRSI may use a nucleus inducing another nuclear magnetic resonance, for example, 13C, 15N, 17O, 19F, 23Na, 31P, or the like as an object, instead of using a hydrogen atomic nucleus.

Further, similar to diffusion-weighted imaging (DWI) in which molecular diffusion of water molecules is imaged, diffusion-weighted spectroscopy (DWS) or diffusion-weighted spectroscopic imaging (DWSI) in which molecular diffusion of various molecules is measured is used.

In DWS and DWSI, a body motion such as a breathing motion or a heartbeat causes a phase fluctuation or a frequency fluctuation during the application of a diffusion gradient magnetic field, and thus a problem of a body motion artifact such as a deterioration in the signal intensity of integrated spectra, in spite of the integration being performed in order to increase a signal noise ratio (SNR), or an increase in a line width is reported. Also in MRS and MRSI, a change in the position of a lung due to a breathing motion or a change in a boundary surface with air having a large difference in magnetic susceptibility may cause a problem of a body motion artifact, similar to DWS and the like. In particular, when the intensity of a static magnetic field is increased in order to effectively acquire a weak metabolite signal, the influence of a difference in magnetic susceptibility is increased, and a problem of a body motion artifact also becomes serious.

As a method of solving a problem of a body motion artifact, a method of reducing a body motion artifact of DWSI is proposed in Japanese Patent No. 3369688 and Japanese Patent No. 5189203. In a method disclosed in Japanese Patent No. 3369688, signals from water protons (hereinafter, referred to as water signals) are left to a certain extent without being suppressed with respect to a portion of a linear region in a region generating a magnetic resonance signal, thereby correcting a frequency fluctuation or a phase fluctuation due to a body motion in the region on the basis of the water signal. In a method disclosed in Japanese Patent No. 5189203, metabolite spectra from a surface generating a magnetic resonance signal are collectively acquired using a vibration gradient magnetic field, and a frequency fluctuation or a phase fluctuation is corrected by self-reference or using a navigator echo.

In addition, JP-A-2015-116366 is not related to spectroscopy or a spectroscopic technique, and discloses a method of retrospective cine imaging in which a body motion signal is acquired at the same time as when a magnetic resonance signal is acquired while continuously changing phase encoding at the time of performing cine imaging of a heart, and reconstruction is performed after aligning phase encoding on the basis of the body motion signal. Further, as a general method, synchronization imaging is used in which imaging is suspended until a certain condition is satisfied on the basis of a body motion signal, and the imaging is started when the certain condition is satisfied.

In DWSI proposed in Japanese Patent No. 3369688, it is difficult to control the remaining of water signals. For example, when an excessive number of water signals are left, it is difficult to extract a metabolite spectrum. On the contrary, when water signals are not left, it is not possible to sufficiently perform correction. Further, in a case of DWS or DWSI, water signals are also attenuated in accordance with the application intensity of a diffusion gradient magnetic field, and thus it is difficult to hold remaining signals above a certain level. For this reason, a sufficient correction effect may not be obtained.

In DWSI proposed in Japanese Patent No. 5189203, measurement data including spectrum information is acquired using a vibration gradient magnetic field by one excitation in order to perform body motion correction for each excitation (one shot). For this reason, an SNR is reduced, and thus there is the possibility that a correction effect is reduced when frequency correction or phase correction is performed.

In the retrospective cine imaging proposed in JP-A-2015-116366, a spectrum of a metabolite is not used as an object to be measured, and thus frequency correction or phase correction of a spectrum is not disclosed.

SUMMARY OF THE INVENTION

An object of the invention is to effectively reduce the influence of a frequency fluctuation or a phase fluctuation due to a body motion in spectrum measurement using a magnetic resonance measuring apparatus.

According to the invention, in order to solve the above-described problem, body motion signals and frequencies or phases of spectra are held in association with each other, and the spectra are corrected on the basis of the relationship therebetween.

That is, according to the invention, there is provided a magnetic resonance measuring apparatus including a measurement unit that measures nuclear magnetic resonance signals emitted from an inspection object, a computational calculation unit that calculates spectrum information of molecules or nuclei included in the inspection object by using the nuclear magnetic resonance signal measured by the measurement unit, and a body motion information recording unit that records measurement signals measured by the measurement unit in association with body motion signals indicating periodic movement of the inspection object during the measurement of the measurement signals. The computational calculation unit includes a spectrum calculation unit that calculates spectra from the measurement signals, a correction unit that corrects the measurement signals or the spectra on the basis of a relationship between a phase fluctuation and/or a frequency fluctuation of the spectrum and the periodic movement, and a synthesis unit that synthesizes the measurement signals and/or the spectra corrected by the correction unit.

According to the invention, it is possible to suppress a frequency fluctuation or a phase fluctuation of a spectrum which occurs due to a body motion (a breathing motion, a heartbeat, or the like) of an object or a diffusion-weighted spectrum.

DETAILED DESCRIPTION OF THE INVENTION

Figure 1:
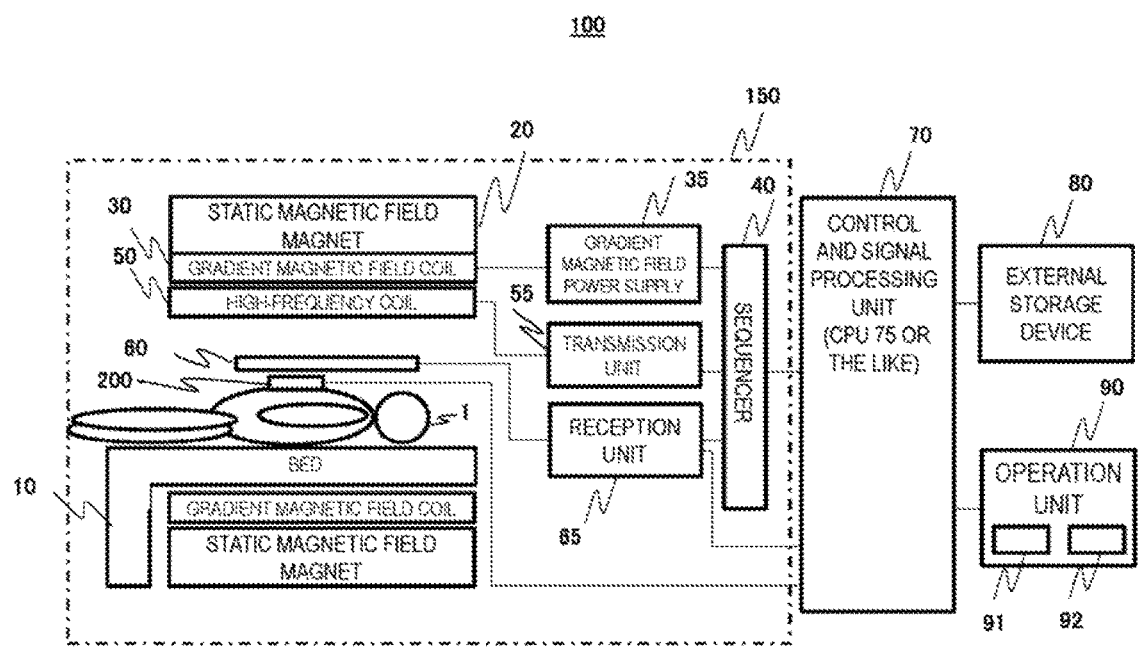
FIG. 1 is a block diagram showing an example of the entire configuration of a magnetic resonance measuring apparatus.

Hereinafter, specific embodiments for implementing the invention will be described with reference to the accompanying drawings. Meanwhile, in all diagrams showing the embodiments of the invention, components having the same function will be denoted by the same reference numerals and signs, and a description thereof will not be repeated.

First, an MRI apparatus which is an aspect of a magnetic resonance measuring apparatus of the invention will be described.

The MRI apparatus obtains a tomographic image of an inspection portion of an object or functional information of a living body by using a nuclear magnetic resonance phenomenon. FIG. 1 shows an outline of an MRI apparatus 100. As shown in FIG. 1, the MRI apparatus 100 includes a bed 10 having an inspection object (hereinafter, referred to as an object) 1 placed thereon, a static magnetic field generating magnet 20 that generates a static magnetic field in a space having the object 1 placed therein, a gradient magnetic field coil 30 that generates a gradient magnetic field, a high-frequency coil 50 for transmission that irradiates the object 1 with an RF pulse, a high-frequency coil 60 for reception that receives a nuclear magnetic resonance signal emitted from the object 1, a control and signal processing unit 70 that processes a received signal and performs various other processes and control, a sequencer 40, an external storage device 80, and an operation unit 90 which is operated by an operator. Some or all of the functions of the control and signal processing unit 70 are realized by a CPU 75.

The static magnetic field generating magnet 20 includes a permanent magnet type using a permanent magnet, a normal conduction type using a normal conduction magnet, and a superconductive type using a superconducting electromagnet. In addition, a magnetic field system includes a vertical magnetic field system in which a static magnetic field is generated in a direction perpendicular to the body axis of the object 1 and a horizontal magnetic field system in which a static magnetic field is generated in a direction parallel to the body axis of the object 1. The former is used for an open-type MRI apparatus in which a magnet is disposed at an upper bound, and the latter is used for a tunnel-type MRI apparatus. The invention is also effective in both the systems.

The gradient magnetic field coil 30 is constituted by three sets of coils that apply a gradient magnetic field in directions of three axes of X, Y, and Z which constitute a coordinate system of an MRI apparatus, that is, a stationary system and are connected to a gradient magnetic field power supply 35. The gradient magnetic field power supply 35 is driven of each of the coils in accordance with a command received from the sequencer 40, thereby applying gradient magnetic fields Gx, Gy, and Gz in the three axes of X, Y, and Z.

The high-frequency coil 50 for transmission irradiates the object 1 with an RF pulse in order to cause nuclear magnetic resonance in atomic nucleus spin of atoms constituting a biological tissue of the object 1, and is connected to a transmission unit 55 including a high-frequency oscillator, a modulator, a high-frequency amplifier, and the like which are not shown in the drawing. The transmission unit 55 performs amplitude modulation of an RF pulse which is output from the high-frequency oscillator by the modulator at a timing based on an instruction given from the sequencer 40, amplifies the RF pulse having been subjected to the amplitude modulation by the high-frequency amplifier, and supplies the amplified RF pulse to the high-frequency coil 50 which is disposed in proximity to the object 1. Thereby, the object 1 is irradiated with the RF pulse from the high-frequency coil 50.

The high-frequency coil 60 for reception detects a nuclear magnetic resonance signal which is an echo signal discharged by nuclear magnetic resonance of atomic nucleus spin of atoms constituting a biological tissue of the object 1, and is connected to a reception unit 65 including a signal amplifier, an orthogonal phase detector, an A/D converter that converts an analog signal into a digital signal, and the like which are not shown in the drawing. An NMR signal, which the object 1 responds to, which is induced by electromagnetic waves emitted from the high-frequency coil 50 for transmission is detected by the high-frequency coil 60 which is disposed in proximity to the object 1, is amplified by a signal amplifier, and is divided into signals of two systems perpendicular to each other by the orthogonal phase detector at a timing based on an instruction given from the sequencer 40. Each of the signals obtained by the division is converted into a digital amount by the A/D converter, is transmitted to the control and signal processing unit 70, and is processed. Meanwhile, a configuration may also be adopted in which a signal is directly converted into a digital amount by the A/D converter without going through an orthogonal phase detector.

The sequencer 40, which is a control unit that repeatedly applies an RF pulse and a gradient magnetic field pulse by a predetermined pulse sequence, is operated under the control of the CPU 75 and transmits various commands necessary for data collection of tomographic images of the object 1 to the transmission unit 55, the gradient magnetic field power supply 35, and the reception unit 65. Meanwhile, the static magnetic field generating magnet 20, the gradient magnetic field coil 30, the high-frequency coil 50 for transmission, the high-frequency coil 60 for reception, driving systems thereof (35, 55, 65), and the sequencer 40 are collectively referred to as a measurement unit 150.

The control and signal processing unit 70 performs various types of data processing, displays processing results, and stores processing results and necessary information. The external storage device 80 such as an optical disc, a magnetic disc, a ROM, or a RAM and the operation unit 90 including a display device 91 and an input device 92 are connected to the control and signal processing unit. When data received from the reception unit 65 is input to the CPU 75, the CPU 75 performs processing such as signal processing and image reconstruction, displays a tomographic image and spectrum information of the object 1 which are results thereof on the display device (display) 91, and records the tomographic image and the spectrum information in a magnetic disc of the external storage device 80, and the like.

In addition, the control and signal processing unit 70 takes up a signal (body motion signal) applied from a body motion monitor 200 which is attached to the object 1, apart from the apparatus, and corrects an NMR signal and data deriving from the signal by using a body motion signal.

The operation unit 90 inputs control information necessary for processing performed by the control and signal processing unit 70, and includes an input device 92 such as a pointing device or a keyboard. The pointing device is, for example, a track ball, a mouse, a touch panel, or the like, and is used to input a positional relationship with respect to display contents displayed on the display or to perform a selection operation with respect to display contents. The input device 92 is disposed in proximity to the display 91, and an operator can interactively control various types of processing of the MRI apparatus through the input device 92 while viewing the display 91. Meanwhile, the control and signal processing unit 70 and the operation unit 90 do not need all of the elements described above and shown in FIG. 1, and may be constituted by some of the elements.

Meanwhile, in FIG. 1, the high-frequency coil 50 for transmission and the gradient magnetic field coil 30 are installed within a static magnetic field space into which the object 1 is inserted so as to face the object 1 in a case of a vertical magnetic field system and so as to surround the object 1 in a case of a horizontal magnetic field system. In addition, the high-frequency coil 60 for reception is installed so as to face the object 1 or surround the object 1.

The body motion monitor 200, which is a device detecting a breathing motion and a heart rate of the object 1, transmits the detected motion of the object to the control and signal processing unit 70 as a digitalized body motion signal. As a detection device of a breathing motion, for example, an air cushion is used. The air cushion brings the device close to an object's chest or abdomen to thereby detect a breathing motion by air pressure expelled by the breathing motion and convert the detected breathing motion into data. A pulse oximeter, a cuff, or an electrocardiogram is used as a heartbeat detection device. The device is brought close to a fingertip, an arm, or a chest to thereby detect a heartbeat and convert the detected heartbeat into data. Meanwhile, any of other devices may be used as the body motion monitor. For example, a video or the like may be used in order to detect a breathing motion. In addition, in a case where an imaging method of detecting a body motion using a navigator echo is used together, a device for a body motion monitor may not be provided. Meanwhile, a body motion monitor as an external device and a body motion monitor using a navigator echo are also collectively referred to as a body motion detection unit.

At present, a nuclide to be imaged of a magnetic resonance measuring apparatus is a hydrogen atomic nucleus (hereinafter, referred to as a proton) which is a main constituent material of an object, as a nuclide that has become widespread for clinical use. Information regarding spatial distribution of proton density and spatial distribution of an alleviation time of an excited state is imaged, thereby imaging a form such as the head, abdomen, and limbs, functions, and biological information of a human body in one-dimensional to three-dimensional manners. Further, in MRS and MRSI, spectroscopy in which the types of molecules constituted by hydrogen atomic nuclei are separated by chemical shift, or a spectroscopic image for acquiring spatial distribution while separating the types of molecules by chemical shift is measured. A magnetic resonance measuring apparatus for research measures the density distribution of 13C, 15N, 17O, 19F, or 31P which induces a magnetic resonance phenomenon by a nucleus other than a hydrogen atomic nucleus, or spectroscopy or a spectroscopic image in which constituent molecular species are separated by chemical shift.

The magnetic resonance measuring apparatus of the invention includes a unit that corrects the influence of a body motion on a phase and frequency of a spectrum to be measured, when measurement such as MRS, MRSI, DWS, or DWSI based on the acquisition of spectrum information is performed. In a case where a frequency fluctuation or a phase fluctuation due to a body motion occurs, simple integration results in a deterioration in a spectrum, but it is possible to suppress such a deterioration by adding a process of performing frequency correction and phase correction on the basis of a body motion signal. Such a correction unit is specifically provided as a function of the control and signal processing unit 70.

Figure 2:
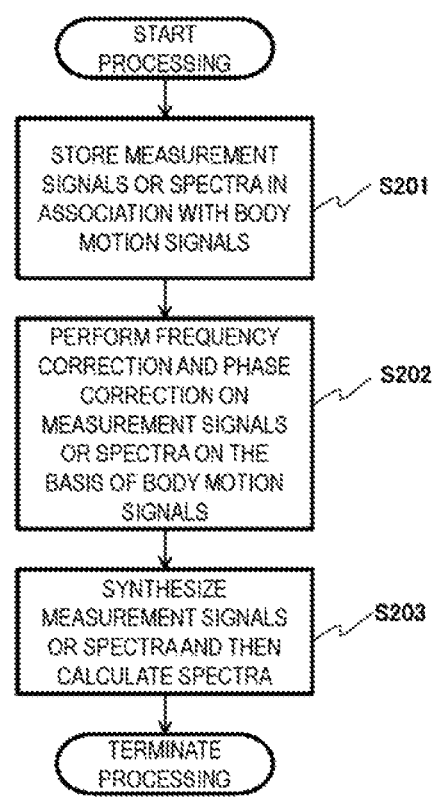
FIG. 2 is a diagram showing an outline of a processing procedure in the magnetic resonance measuring apparatus.

An outline of process of the control and signal processing unit 70 is shown in FIG. 2. First, measurement signals acquired in respective measurements or spectra calculated from the signals, and body motion signals acquired at the same time as the spectra are recorded in association with each other (S201). Next, measurement signals or spectra are arranged on the basis of the body motion signal, and either one or both of frequency correction and phase correction based on the body motion signal (hereinafter, referred to as frequency correction and/or phase correction) are performed thereon (S202). The corrected measurement signals or spectra are synthesized to thereby calculate a synthesized measurement signal or a synthesized spectrum (S203). In a case where a measurement signal is corrected, a synthesized spectrum is calculated from a synthesized measurement signal. Meanwhile, the term "synthesis" as used herein refers to process such as integration, weighted integration based on the number, averaging, or weighted averaging based on the number.

The above-described functions are realized by the CPU 75 included in the control and signal processing unit 70 which reads and executes predetermined programs. However, some of the functions may be realized by hardware such as an ASIC or an FPGA, instead of being realized by software.

Hereinafter, specific embodiments of data processing in the control and signal processing unit 70 will be described.

First Embodiment

This embodiment relates to measurement (MRS) of nuclear magnetic resonance frequency distribution (spectrum) of molecules or nuclides included in an inspection object. In this embodiment, the measurement unit 150 measures a nuclear magnetic resonance signal from one region or a plurality of regions of an inspection object, and the control and signal processing unit 70 (computational calculation unit) calculates spectra of the region or the plurality of regions. At this time, a phase and frequency of a spectrum which fluctuate depending on a periodic motion of an inspection object are corrected.

Figure 3:
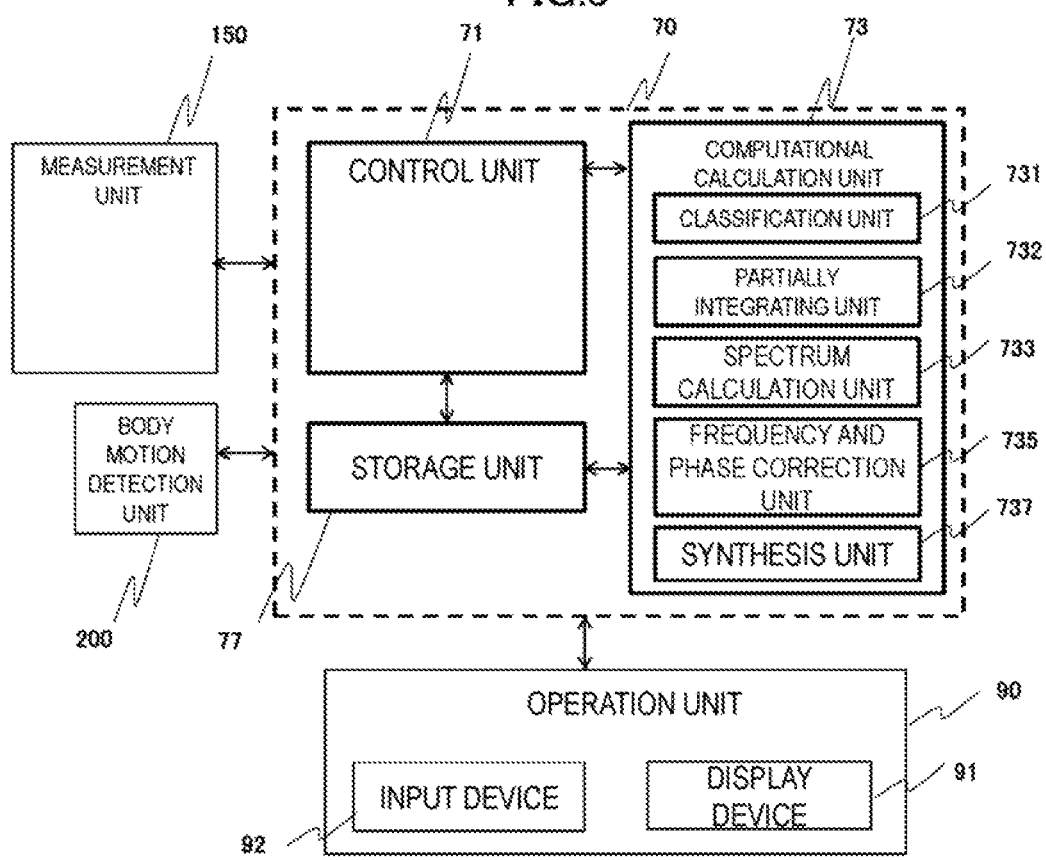
FIG. 3 is a functional block diagram mainly showing functions of a control and signal processing unit according to a first embodiment.

An example of the control and signal processing unit 70 in this embodiment is shown in FIG. 3. As shown in the drawing, the control and signal processing unit 70 is roughly constituted by a control unit 71, a computational calculation unit 73, and a storage unit 77.

The control unit 71 performs the overall control of the apparatus which includes the control of operation of the measurement unit 150, the display control of the operation unit 90 (display device 91), and the control of communication between units. The computational calculation unit 73 performs various computational calculation on measurement data measured by the measurement unit 150, and includes a classification unit 731 that classifies pieces of measurement data or spectra calculated from the measurement data into measurement data or a spectrum for each time phase by using a body motion signal, a partially integrating unit 732 that performs an integration process of measurement signals or spectra for respective classification groups, a spectrum calculation unit 733 that calculates a spectrum from measurement data, a correction unit 735 that corrects at least one of a frequency and a phase of a measurement signal or a spectrum, and a synthesis unit 737 that synthesizes the classified pieces of measurement data or spectra after correction, as main functional units.

The storage unit 77 stores raw data measured by the measurement unit 150 and a body motion signal which is transmitted from a body motion detection unit, and stores parameters necessary for the computational calculation of the computational calculation unit 73, data during the computational calculation, and the like. In addition, the storage unit 77 functions as a body motion information recording unit that stores measurement data in association with a body motion signal. Some of the functions of the storage unit 77 may be allocated to the external storage device 80.

Figure 4:
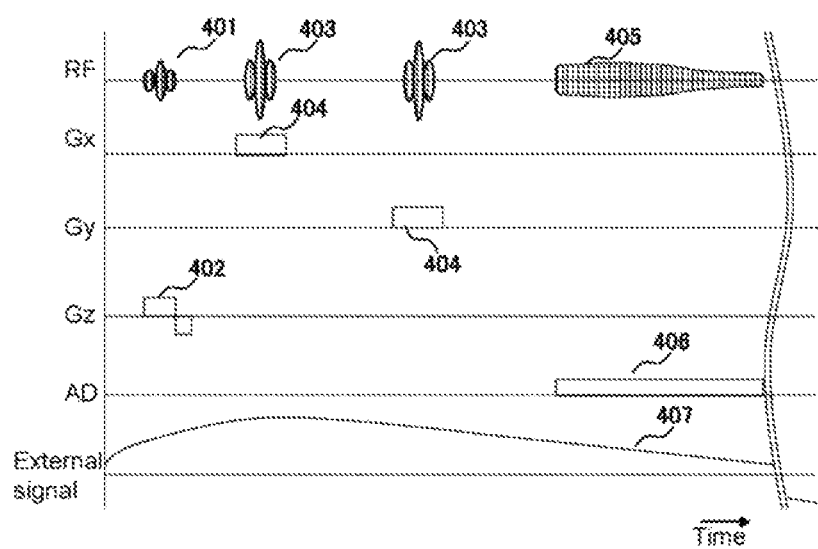
FIG. 4 is a diagram showing an example of an MRS pulse sequence which is performed by a magnetic resonance measuring apparatus according to the first embodiment.

Next, MRS measurement performed by the measurement unit 150 in this embodiment will be described. FIG. 4 shows an example of a representative pulse sequence which is used in MRS measurement. In this pulse sequence, a magnetic resonance signal 405 is generated from a rectangular parallelepiped region of an inspection object. For this reason, first, an excitation pulse 401 and a slice selection gradient magnetic field 402 are applied to thereby selectively excite a slice on an XY plane. Next, an inverted pulse 403 and a slice inverted gradient magnetic field 404 are applied to selectively invert a slice on a YZ plane. Thereafter, an inverted pulse 403 and a slice inverted gradient magnetic field 404 are applied to selectively invert a slice on an XZ plane. Thereby, the rectangular parallelepiped region is excited in accordance with the former selective excitation, and a magnetic resonance signal 405 is generated from this region. The generated magnetic resonance signal 405 is measured in a signal acquisition period 406. During this period, a signal applied from the body motion monitor 200 mounted to the object 1 is measured as a body motion signal 407. The measurement is normally repeated a plurality of times in order to improve an SNR.

Meanwhile, the pulse sequence of FIG. 4 shows an example of MRS measurement, and is not limited thereto. For example, the selection of XYZ axes and the setting of obliqueness may be performed, and the application of a pre-pulse for suppression of a water signal or an out-of-region selection suppression pre-pulse may be performed before this pulse sequence. In addition, irradiation with an excitation pulse may be performed instead of performing irradiation with an inverted pulse. In addition, measurement may be performed in which a time required for waiting for the restoration of magnetization is reduced by setting a plurality of excitation regions instead of setting one excitation region and by performing excitations in order.

The magnetic resonance signal 405 (referred to as a measurement signal) obtained by such MRS measurement is stored in the storage unit 77 or the external storage device in association with a body motion signal during the measurement, and is then processed by the computational calculation unit 73. An outline of operation of the control and signal processing unit 70, mainly, the computational calculation unit 73 will be described with reference to a flow chart of data processing shown in FIG. 5. The processing may be either a process (FIG. 5A) of calculating a spectrum after the correction of a measurement signal or a process (FIG. 5B) of correcting a spectrum after the spectrum is calculated from a measurement signal.

Details of data processing of this embodiment will be described using a case where the process of FIG. 5A is performed, as an example.

The MRS measurement as shown in FIG. 4 is performed a plurality of times, and measurement signals acquired in respective measurements are Fourier-transformed in a time direction, thereby calculating spectra (S501). The spectra are held in the storage unit 77 in association with body motion signals acquired at the same time as the measurement signals (S502). The classification unit 731 classifies the spectra by determining to which classification group each body motion signal belongs, with reference to classification groups of body motion time phases which are set in advance (S503).

Figure 6:
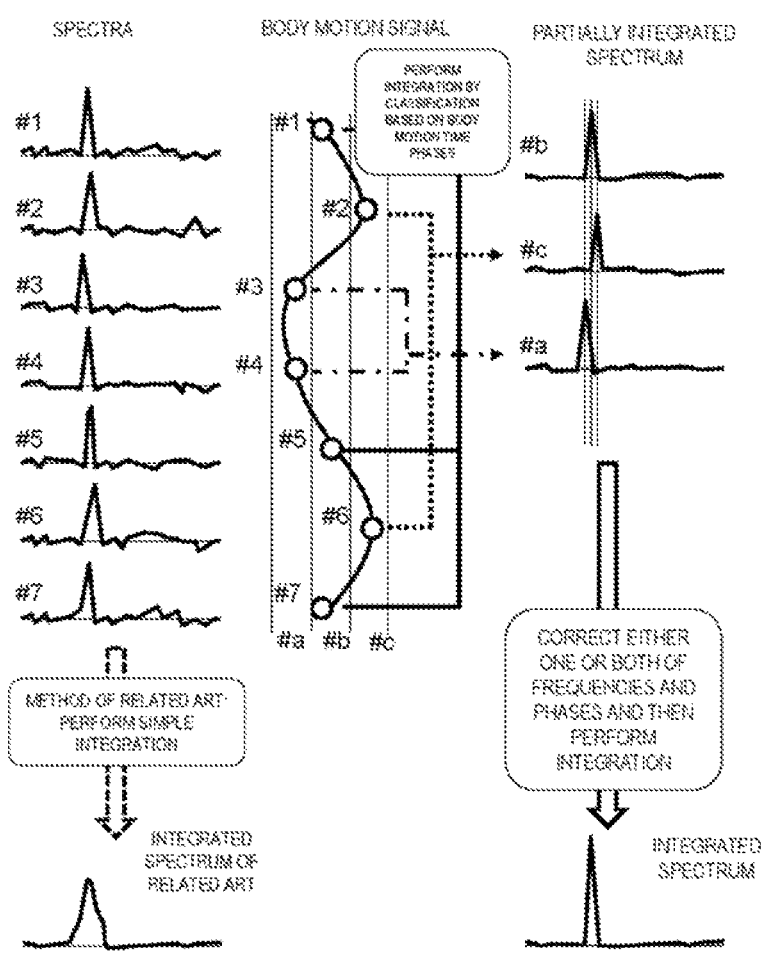
FIG. 6 is a diagram showing a flow and effects of the data processing according to the first embodiment.

The classification groups of the body motion time phases referred to by the classification unit 731 are obtained by classifying the body motion time phases into a plurality of groups by using a predetermined method. The classification method is roughly classified into two types of methods, and either one of them may be adopted. One of the classification methods is a method of setting a plurality of ranges using the magnitude of a body motion as an index, as disclosed in, for example, JP-A-2006-3114491. A technique disclosed in JP-A-2006-3114491 relates to gating in which a range in which a breathing motion is small is designated, and measurement is performed at only a time when a breathing motion falls within the range. However, in the invention, a plurality of ranges are set depending on the magnitude of a breathing motion by using only a classification method which is the same as the method in JP-A-2006-3114491, and may be used as retrospective time phases instead of gating. Thereby, for example, as shown in FIG. 6, ranges are classified into ranges #a, #b, and #c depending on the magnitude of a body motion. Regarding the magnitude of a body motion, a navigator echo is used as the magnitude of a body motion in JP-A-2006-3114491, but the technique is not limited thereto. An output of an external breathing motion monitoring device, a pulsation monitoring device, an electrocardiographic device, or the like may be set as the magnitude of a body motion. In addition, a method of dividing a range according to the magnitude of a body motion includes a method of inputting the number of parts obtained by division by using a GUI and a parameter file and equally dividing a maximum value and a minimum value of a body motion by using the number of parts, and a method of inputting maximum and minimum divided ranges by using a parameter file.

The other method of classifying body motion time phases is a method of setting a plurality of ranges with triggers based on a body motion and a cycle which is an interval therebetween as indexes by using the periodicity of a body motion as disclosed in, for example, JP-A-2015-116366. In JP-A-2015-116366, a time phase division method using an electrical activity as a trigger signal is disclosed in detail, but the technique is not limited thereto. An output of a heartbeat monitoring device or a breathing motion monitoring device, and a navigator echo may be used. A method of dividing body motion time phases depending on a time from a trigger signal includes a method of inputting the number of parts obtained by division by using a GUI and a parameter file and equally dividing an average cycle between trigger signals by using the number of parts, and a method of inputting start and termination times of divided ranges at a ratio with respect to an average cycle.

Meanwhile, time phase classification based on the magnitude of a body motion is easily used for a breathing motion, and time phase classification based on a trigger is easily used for a heartbeat such as a heart rate or an electrical activity. This is because the cycle and magnitude of a breathing motion tend to change, while the cycle and magnitude of a heartbeat change a little.

After spectra are classified, the partially integrating unit 732 integrates spectra for each classification group to thereby calculate partially integrated spectra for each classification group (S504). The "partially integrated spectrum" on the right side of FIG. 6 indicates a state where spectra classified into classification groups #a to #c are integrated. Thereafter, either one or both of frequency correction and phase correction are applied to the partially integrated spectra so that either one or both of frequencies and phases of partially integrated spectra for each classification group become equal to each other in all of the partially integrated spectra (S505).

Hereinafter, phase correction and frequency correction of a spectrum will be described in detail.

A spectrum acquired for the n-th time is indicated by a complex value function $S(f,n)$ (here, f is a frequency). A result obtained by mapping a body motion at the n-th measurement point in time to a body motion time phase classification m is denoted by $T(n)$.

At this time, partially integrated spectra for each body motion time phase classification are calculated by Expression (1-1) and Expression (1-2).

$$R(f,m)=\mathrm{Sum}\{S(f,n); T(n)=m\} \quad (1\text{-}1)$$

$$C(m)=\mathrm{Sum}\{1; T(n)=m\} \quad (1\text{-}2)$$

In Expression (1-1), $R(f,m)$ denotes a complex value function indicating a partially integrated spectrum. In Expression (1-2), $C(m)$ denotes the number of spectra integrated into a body motion time phase classification m.

A function for extracting a spectrum peak is applied to a partially integrated spectrum $R(f,m)$ to thereby obtain a complex value $P(m)$ of the spectrum peak and a central frequency $F(m)$ of the spectrum peak. Here, the function for extracting a spectrum peak is a function for returning a frequency with which an absolute value of a spectrum has a maximum value, and the complex value thereof.

Further, a most frequent value Mf of a central frequency $F(m)$ and a most frequent value Mp of a phase $\mathrm{Arg}(P(m))$ of a spectrum peak $P(m)$ are calculated.

$$Mf=F(\arg \max(C(m))) \quad (2\text{-}1)$$

$$Mp=\mathrm{Arg}(P(\arg \max(C(m)))) \quad (2\text{-}2)$$

Frequency correction and phase correction are performed on a partially integrated spectrum $R(f, m)$ by the next Expression (3) using the most frequent values Mf and Mp as a reference frequency Mf and a reference phase Mp, thereby obtaining a partially integrated spectrum R' after correction.

$$R'(f,m)=R(f-(R(m)-Mf),m)\times\mathrm{Exp}(-i(\mathrm{Arg}(P(m))-Mp)) \quad (3)$$

In the expression, i denotes an imaginary unit.

Meanwhile, Expression (3) may be changed to Expression (31) in a case where only frequency correction is performed, and Expression (3) may be changed to Expression (32) in a case where only phase correction is performed.

$$R'(f,m)=R(f-(F(m)-Mf),m) \quad (31)$$

$$R'(f,m)=R(f,m)\times\mathrm{Exp}(-i(\mathrm{Arg}(P(m))-Mp)) \quad (32)$$

Meanwhile, the above-described correction method is just an example, and the correction method includes various modifications. For example, a method of fitting a spectrum by a Gaussian function and returning the central frequency and a complex value at the central frequency without simply taking a maximum value as a function for extracting a spectrum peak may also be adopted. Further, a method of searching for a frequency band of a spectrum peak to be selected in a range which is set in advance may also be adopted. Thereby, for example, it is possible to suppress a case where a water signal, which is not completely suppressed, is erroneously selected. Further, the number of spectrum peaks to be selected may be plural instead of being one. For example, it is possible to obtain a plurality of peaks by resolving a spectrum on an assumption indicated by a sum of synthesis of a plurality of Lorentz functions. A reference frequency and a reference phase in a case where a plurality of peaks are obtained may be calculated using an average value of the peaks and by selecting peaks in a specific frequency range.

In addition, an average (Mp0, Mp1) may be calculated using a value (p0, p1) obtained by primary approximation from phases of a plurality of peaks, instead of using one real number value, as a reference phase obtained from a plurality of peaks. In this case, a spectrum having been subjected to phase correction is calculated by the next Expression (33).

$$R'(f,m)=R(f,m) \times \text{Exp}(-i((p1(m)-Mp1)f+(p0(m)-Mp0))) \quad (33)$$

The frequency correction and the phase correction are disclosed in detail in, for example, Japanese Patent No. 5189203.

As described above, frequency correction or phase correction is performed on a partially integrated spectrum, and the corrected partially integrated spectrum is synthesized, thereby calculating a synthesized spectrum (S506). The synthesis may be simple integration or weighted integration using a predetermined weight. For example, in a case of "weighted integration" of partially integrated spectra using the number of spectra as a weight, an added and integrated spectrum Q is expressed by the following expression.

$$Q(f)=\text{Sum}\{R'(f,m) \times C(m),m\}/\text{Sum}\{C(m),m\} \quad (4)$$

Weighted integration is performed, and thus it is possible to increase an SNR of a spectrum having been subjected to the integration.

In addition, in a case where simple addition is performed without performing weighted integration, Expression (4) may be changed to Expression (41).

$$Q(f)=\text{Sum}\{R'(f,m),m\} \quad (41)$$

Further, an SNR is calculated with respect to a spectrum R'(f,m) having been subjected to the addition, and it is also possible to perform weighted integration using the SNR as a weight. The SNR can be calculated by Expression (5), and the weighted integration in this case is expressed by Expression (6).

SNR=(absolute value of peak)/(standard deviation in portion having no peak) (5)

$$Q(f)=\text{Sum}\{R'(f,m)*\text{SNR}(m),m\}/\text{Sum}\{\text{SNR}(m);m\} \quad (6)$$

Thereby, it is possible to perform weighted integration for maximizing a signal-to-noise ratio.

As described above, the processing of the computational calculation unit in this embodiment has been described along the flow chart shown in FIG. 5A. However, as shown in FIG. 5B, measurement signals are classified depending on body motion signals (S512) before a spectrum is calculated from the measurement signal, integration is performed for each classification group (S513), and at least one of a phase and a frequency of the measurement signal having been subjected to the integration is corrected (S514). Thereafter, a spectrum may be calculated from the measurement signal. In this case, the spectra may be synthesized after the spectra are calculated from partially integrated measurement signals (S515, S516), or the spectra may be calculated from synthesized measurement signals after the partially integrated measurement signals having been subjected to the correction are synthesized as indicted by a dotted line in the drawing (S525, S526). Meanwhile, the measurement signal is a function of a time t, but is expressed as a complex value function S(t,m) similar to a spectrum, and thus it is possible to correct a phase and a time axis (corresponding to a frequency) by using the same method as phase correction and frequency correction of a spectrum.

According to this embodiment, after spectra obtained by a plurality of times of measurement are classified on the basis of body motion signals during the measurements, partially integrated spectra are obtained for each classification group. Then, correction is performed so that phases and frequencies conform to each other between partially integrated spectrums, and integration is performed. Therefore, it is possible to reduce the influence of a frequency fluctuation or a phase fluctuation of a spectrum which is caused by a body motion and to increase the accuracy of the spectrum.

FIG. 6 is a schematic diagram showing data processing in this embodiment and the effects thereof. As shown on the left side of FIG. 6, when spectra #1 to #7 having a frequency fluctuation occurring due to a body motion are simply integrated, deterioration occurs in integrated spectra. On the other hand, partially integrated spectra #a to #c are calculated by performing classification into present ranges #a to #c on the basis of body motion signals #1 to #7 acquired at the same time as the spectra #1 to #7. In addition, correction is performed so as to align either one or both of frequencies and phases of the partially integrated spectra, and integration is performed, thereby allowing a deterioration in the integrated spectra to be suppressed. In particular, since a magnetic resonance signal of a weak metabolite is acquired in the spectra #1 to #7, an SNR is low, and an error tends to occur in a correction value to be calculated when there is an attempt to independently perform frequency correction or phase correction. Since data which is originally treated as noise is also added, a peak rises, and a baseline is lifted.

In the data processing in this embodiment, classification is performed based on body motion time phases to thereby calculate partially integrated spectra, and thus it is possible to satisfactorily perform correction even when an SNR of each spectrum is low.

Meanwhile, all spectra are integrated in this embodiment, a modification, such as addition of an outline removal process of removing a spectrum having an extremely deteriorated SNR, or truncation performed in a case where the number of partially integrated spectra does not reach a threshold value, may be made. In FIG. 6, a spectrum of a single peak is shown in order to simplify a description, but spectra of a plurality of peaks are generally used. In this case, a modification, such as frequency correction and phase correction using all peaks or frequency correction and phase correction using some peaks, for example, a maximum peak or a peak having a value equal to or greater than a certain threshold value, may be made.

First Modification Example of First Embodiment

In the first embodiment, body motion signals are classified into a plurality of classification groups in advance depending on the magnitudes (amplitudes) thereof, and measurement signals or spectra calculated from the signals are associated with any one classification group. However, in this modification example, phases and/or frequencies of measurement signals or spectra and time phases of body motion signals are approximated to a periodic function (herein, referred to as a time phase relational expression), and are associated with time phases.

Figure 7:
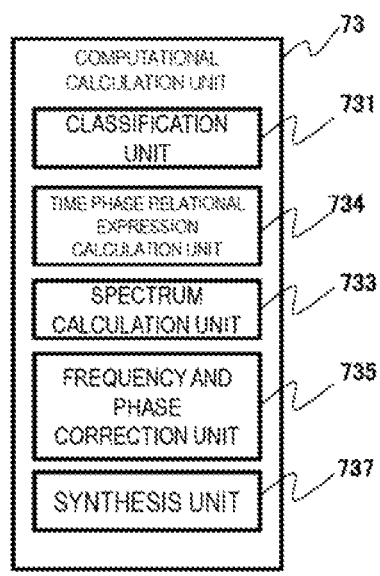
FIG. 7 is a functional block diagram of a control and signal processing unit according to a first modification example of the first embodiment.

A functional block diagram of the computational calculation unit 73 of this modification example is shown in FIG. 7. As shown in the drawing, in this modification example, a time phase relational expression calculation unit 734 is provided instead of the partially integrating unit 732 of the first embodiment. The other components are the same as those in the first embodiment.

Hereinafter, processing in this modification example will be described with reference to a flowchart shown in FIG. 8. Even in this modification example, a correction process of the correction unit 735 may be performed on any of a measurement signal and a spectrum, but a case where a spectrum is corrected will be described as an example below.

First, the spectrum calculation unit 733 calculates spectra by Fourier-transforming measurement signals acquired in respective measurements in a time direction (S801), and holds the calculated spectra in association with body motion signals acquired at the same time as the spectra. On the other hand, the classification unit 731 determines to which time phase each body motion signal corresponds, on the basis of time phases of preset body motion signals, to associate the spectra and the time phases with each other (S802). The time phase of the body motion signal can be set in advance by measuring the body motion signal by a body motion detection unit (body motion monitor 200 or the like) for a predetermined period of time prior to measurement.

Figure 9:
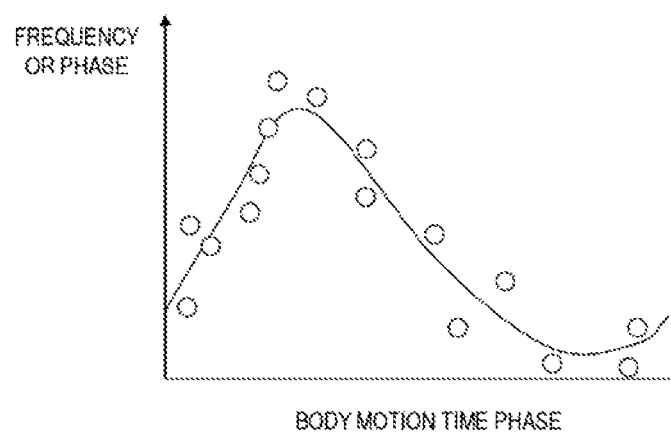
FIG. 9 is a schematic diagram showing a graph of a time phase relational expression created by the data processing according to the first modification example.

Subsequently, the time phase relational expression calculation unit 734 calculates at least one of a frequency and a phase from a spectrum, and calculates a time phase relational expression indicating a relationship between a frequency and a time phase or a relationship between a phase and a time phase (S803). FIG. 9 schematically shows a graph of a time phase relational expression. The horizontal axis represents a body motion time phase, and the vertical axis represents a frequency or a phase. A mark ○ indicates each spectrum which is measured. Each spectrum varies in the position of ○ due to a low SNR, but is fit at many measurement points, thereby calculating a time phase relational expression as indicated by a solid line.

Thereafter, the frequency and phase correction unit 735 applies a time phase associated with each spectrum to a time phase relational expression, and sets a frequency or a phase in the time phase as a frequency or a phase of each spectrum (S804). Thereby, a frequency and a phase of each spectrum caused by a low SNR are corrected. The frequency and phase correction unit 735 further corrects a frequency fluctuation and a phase fluctuation due to a body motion on the corrected frequency and phase of each spectrum (S805). In the correction in this case, for example, a predetermined time phase in a time phase relational expression is set as a reference time phase, and a frequency and a phase of each spectrum are corrected so as to eliminate a difference between a frequency and a phase in the reference time phase and the frequency and the phase of each spectrum. Thereby, frequencies and phases of all of the spectra are aligned.

Finally, the synthesis unit 737 integrates the corrected spectra to thereby calculate an integrated spectrum (S806).

According to this modification example, the correction of a fluctuation due to a body motion is performed after a frequency or a phase of each spectrum is fit to a time phase relational expression, and thus it is possible to satisfactorily perform correction even when an SNR of each spectrum is low, similar to the first embodiment.

Meanwhile, in this modification example, a case where fitting is performed in each of spectra has been described. However, for example, similar to the first embodiment, fitting processing may be performed after partially integrating processing is performed for each group of predetermined time phases. In this case, there is an advantage in that fitting is easily performed by an increase in an SNR at each fitting point.

Second Modification Example of First Embodiment

This modification example is applied to a case where 1H MRS is acquired, and is characterized in that a correction value for correcting a frequency and/or a phase from a spectrum of a signal (hereinafter, referred to as a water signal) from water. In 1H MRS, measurement that includes water suppression (water suppression measurement) and measurement that does not include water suppression (water suppression non-measurement) are performed. In the water suppression measurement, a spectrum is acquired by performing water suppression in order to prevent a metabolite signal from being hidden by a huge water signal. In the water suppression non-measurement, a spectrum of water (hereinafter, referred to as a water spectrum) is acquired without performing water suppression in order to estimate a concentration of a metabolite. The water spectrum obtained in the water suppression non-measurement generally has a high SNR. Consequently, frequency correction and phase correction of the spectrum obtained in the water suppression measurement are performed using data obtained in the water suppression non-measurement.

Figure 10:
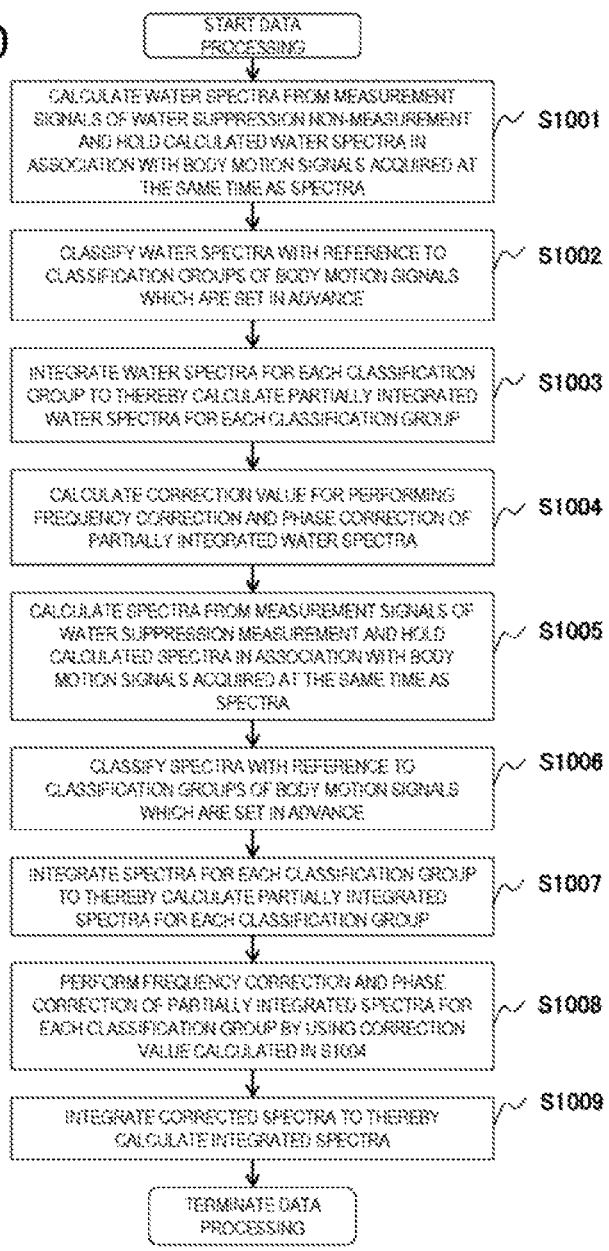
FIG. 10 is a flow chart showing a flow of a process according to a second modification example of the first embodiment.

Even in this modification example, a configuration of the control and signal processing unit 70 (computational calculation unit 73) is the same as that shown in FIG. 3. Hereinafter, processing in this modification example will be described focusing on differences from the first embodiment by appropriately adopting FIG. 3. FIG. 10 shows a flow of processing in this modification example. Here, a description is given of a case where frequency correction and/or phase correction are performed on a spectrum.

First, the spectrum calculation unit 733 calculates water spectra by Fourier-transforming measurement signals acquired in respective measurements of water suppression non-measurement in a time direction, and holds the calculated water spectra in association with body motion signals acquired at the same time as the spectra (S1001). The classification unit 731 classifies the water spectra by determining to which classification group each body motion signal belongs, with reference to classification groups of body motion signals which are set in advance (S1002). Subsequently, the partially integrating unit 732 integrates the water spectra for each classification group to thereby calculate partially integrated water spectra for each classification group (S1003).

The correction unit 735 calculates a correction value of either one or both of frequency correction and phase correction so that either one or both of frequencies and phases of partially integrated water spectra for each classification group become equal to each other in all of the partially integrated water spectra (S1004). A method of calculating a correction value is the same as that in the first embodiment. For example, a most frequent value Mf of a central frequency of a spectrum and a most frequent value Mp of a phase of a spectrum peak are calculated, these values are set as reference values, and a difference from each of the reference value is set as a correction value. In addition, the modification described in the first embodiment may be used as a method of calculating a correction value. A correction value calculated for each spectrum is stored in the storage unit 77.

Subsequently, the spectrum calculation unit 733 calculates spectra by Fourier-transforming measurement signals acquired in respective measurements of water suppression measurement in a time direction, and holds the calculated spectra in association with body motion signals at the same time as the spectra (S1005). The classification unit 731 classifies the spectra by determining to which classification group each body motion signal belongs, with reference to classification groups of body motion signals which are set in advance (S1006). The partially integrating unit 732 integrates spectra for each classification group, to thereby calculate partially integrated spectra for each classification group (S1007). The correction unit 735 corrects frequencies and/or phases of partially integrated spectra for each classification group by using a correction value calculated using a water spectrum (S1008). Finally, the synthesis unit 737 integrates the corrected spectra to thereby calculate an integrated spectrum (S1009).

According to this embodiment, it is possible to satisfactorily correct metabolite spectra having a low SNR by obtaining correction values of a frequency and a phase using a water signal having a high SNR. Thereby, it is possible to realize MRS in which influence on a frequency fluctuation or a phase fluctuation due to a body motion is reduced.

Third Modification Example of First Embodiment

In the first embodiment, a body motion signal is obtained from the body motion monitor 200 which is an external apparatus of the MRI apparatus. However, this modification example is characterized in that a body motion signal is acquired from a navigator echo measured by the measurement unit 150, and is preferably applied to correction that particularly uses a breathing motion as a target. In this modification example, instead of the body motion detection unit 200, a body motion detection unit that calculates a body motion signal by using a navigator echo is provided within the computational calculation unit 73 in the block diagram shown in FIG. 3. In addition, the measurement unit 150 performs a pulse sequence for acquiring a navigator echo.

Figure 11:
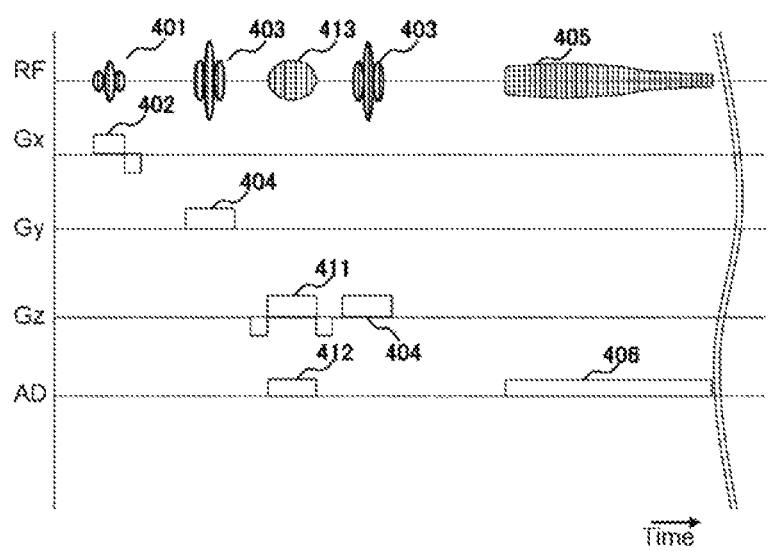
FIG. 11 is a diagram showing an example of an MRS pulse sequence used in a third modification example of the first embodiment.

FIG. 11 shows an example of an MRS pulse sequence including a step of generating and acquiring a navigator echo for detecting a body motion. In FIG. 11, the same components as those in FIG. 4 are denoted by the same reference numerals and signs, and a description thereof will not be repeated. As shown in FIG. 11, in this pulse sequence, an inverted pulse 403 and a slice inverted gradient magnetic field 404 are applied to selectively invert a slice on an XZ plane, and a magnetic resonance signal is generated from a rectangular parallelepiped region (referred to as a columnar region) which is elongated in the Z-direction in accordance with the selective excitation occurring by an excitation pulse 401. A gradient magnetic field 411 for generating a navigator echo is applied before applying the next inverted pulse 403 to generate a navigator echo 413 from this columnar region, thereby acquiring a navigator echo signal in a period 412. The other configurations are the same as those in the pulse sequence of FIG. 3, and an inverted pulse 403 and a slice inverted gradient magnetic field 404 are applied to generate a magnetic resonance signal 405 from a rectangular parallelepiped region.

A body motion time phase is calculated by performing data processing from a profile of a navigator echo. For example, a columnar region generating a navigator echo is set so as to intersect, for example, a diaphragm, and the diaphragm is extracted from the profile to calculate the position thereof, thereby obtaining a body motion signal (body motion curved line) as shown in the middle of FIG. 6. A time phase of a breathing motion is calculated from the body motion curved line. As a method of calculating a time phase of a breathing motion, the method described in the first embodiment, for example, a classification method depending on the magnitude of a body motion, which is disclosed in JP-A-2006-3114491, or a time phase division method using an electrical activity as a trigger, which is disclosed in JP-A-2015-116366, is applied, and it is possible to adopt a method of dividing a time phase from a trigger signal of a breathing motion and an average cycle.

A process of holding a measurement signal, which is measured using the same measurement method as that of a navigator echo, or a spectrum calculated from the measurement signal in association with a body motion (breathing motion) time phase calculated in this manner on the basis of the body motion time phase, performing classification into classification groups determined depending on the time phases, calculating partially integrated spectra, and performing frequency correction and/or phase correction is the same as that in the first embodiment.

Meanwhile, in the example of the pulse sequence shown in FIG. 11, a navigator echo is generated from a rectangular parallelepiped region elongated in the Z-axis direction which includes a rectangular parallelepiped region for measuring MRS, but this does not necessarily have to be performed. A lengthwise direction may be another axial direction or an intermediate direction which is not an axial direction. In addition, a pulse sequence for generating a navigator echo may be added, instead of including a rectangular parallelepiped region for measuring MRS. For example, when MRS measurement of the head is performed, it is also possible to detect a breathing motion by using a navigator echo of the chest. In addition, when MRS measurement of the head is performed, it is also possible to detect a heartbeat by acquiring a navigator echo of the carotid artery or the like.

According to this modification example, it is possible to perform frequency correction and/or phase correction without using a body motion monitor as an external apparatus. In addition, it is possible to capture a motion in a most appropriate direction in a relationship with a measurement region by selecting a position at which a navigator echo is generated.

Second Embodiment

The first embodiment is an embodiment related to MRS measurement to which the invention is applied, but this embodiment is an embodiment related to MRSI measurement to which the invention is applied. That is, in a magnetic resonance measuring apparatus of this embodiment, a measurement unit measures a nuclear magnetic resonance signal from a plurality of regions included in a cross section of an inspection object, and a computational calculation unit includes an image creation unit that creates an image for each molecule or each nuclide included in a cross section. At this time, the image creation unit calculates partially averaged spectroscopic images for each classification based on body motion signals. The computational calculation unit applies at least one of phase correction and frequency correction to the partially averaged spectroscopic images, and then integrates the partially averaged spectroscopic images having been subjected to the correction.

Figure 12:
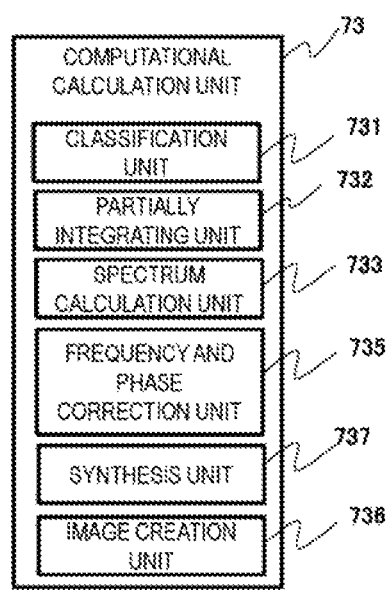
FIG. 12 is a functional block diagram of a control and signal processing unit according to a second embodiment.

An example of a control and signal processing unit 70 (computational calculation unit 73) in this embodiment is shown in FIG. 12. In FIG. 12, the same components as those in FIG. 3 are denoted by the same reference numerals and signs, and a description thereof will not be repeated. The magnetic resonance measuring apparatus of this embodiment is different from that in the first embodiment in that a measurement unit 150 performs an MRSI pulse sequence, and the control and signal processing unit 70 includes an image creation unit 736 that creates an image with respect to a desired frequency from measurement data acquired by the MRSI pulse sequence.

Figure 13:
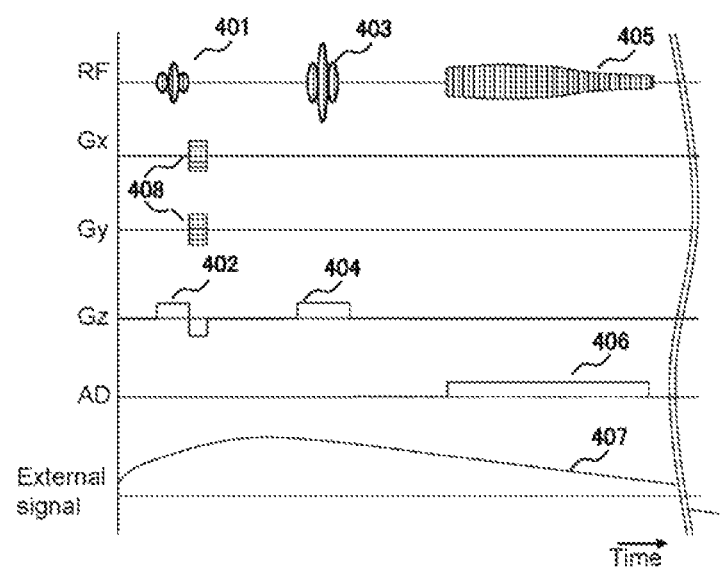
FIG. 13 is a diagram showing an example of an MRSI pulse sequence used in the second embodiment.

First, an MRSI pulse sequence performed by the measurement unit 150 will be described. FIG. 13 is a diagram showing an example of a representative pulse sequence which is used in MRSI measurement. In this pulse sequence, first, an excitation pulse 401 and a slice selection gradient magnetic field 402 are applied to selectively excite a slice on an XY plane. Next, a phase encoding gradient magnetic field 408 is applied to an X-axis and a Y-axis. Next, an inverted pulse 403 and a slice inverted gradient magnetic field 404 are applied to selectively invert a slice on an XY plane, and thus a magnetic resonance signal 405 is generated from a YZ plane in accordance with the former selective excitation. The generated magnetic resonance signal 405 is measured in a signal acquisition period 406. During this period, a signal applied from a body motion monitor 200 mounted to an object 1 is measured as a body motion signal 407. The magnetic resonance signal 405 is repeatedly measured, and the phase encoding gradient magnetic field 408 is repeatedly applied while changing the amount of application thereof, thereby obtaining measurement data corresponding to predetermined phase encoding. Measurement is repeatedly performed by setting a set of measurements of measurement data as one measurement, thereby obtaining a plurality of pieces of measurement data.

Meanwhile, this pulse sequence shows an example of MRSI measurement, and is not limited thereto. For example, the selection of XYZ axes and the setting of obliqueness may be performed, and the application of a pre-pulse for suppression of a water signal or an out-of-region selection suppression pre-pulse may be performed before this pulse sequence. In addition, the generation of a nuclear magnetic resonance signal may be limited to a rectangular parallelepiped region by three times of irradiation with an RF pulse as shown in FIG. 4. In this example, information regarding the distribution of a plane is obtained by applying a phase encoding gradient magnetic field to two axes, but information regarding three-dimensional distribution may be obtained by applying a phase encoding gradient magnetic field to three axes. In addition, three-dimensional distribution information may be obtained by multi-slicing with two axes to which a phase encoding gradient magnetic field is applied.

Figure 14:
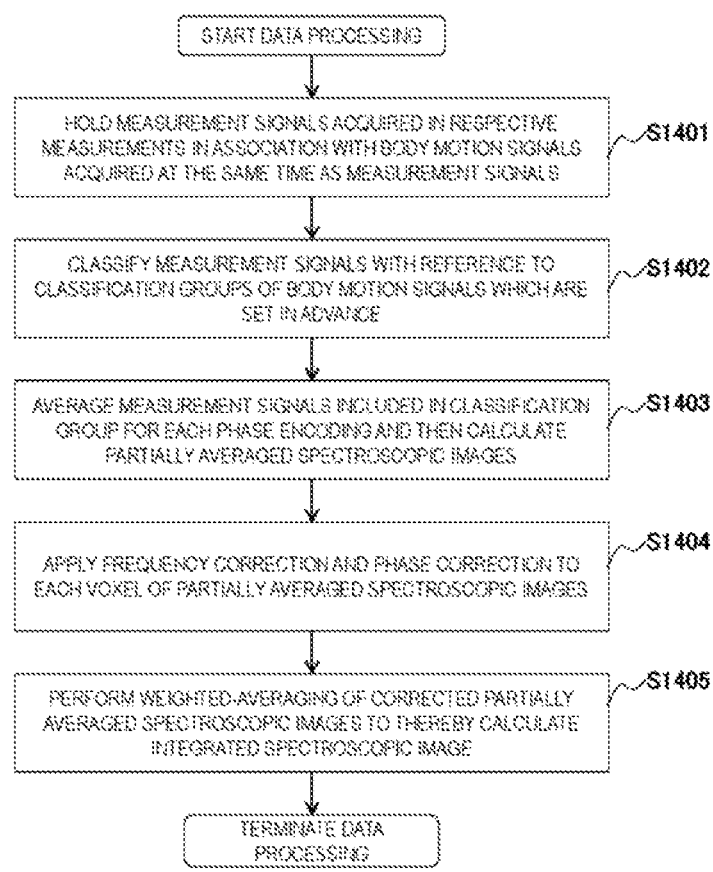
FIG. 14 is a flowchart showing a flow of data processing according to the second embodiment.

Next, processing of measurement data (processing of the computational calculation unit 73) which is obtained by such MRSI measurement will be described with reference to a flow chart shown in FIG. 14.

First, measurement signals acquired in respective measurements and body motion signals acquired at the same time as the measurement signals are held in association with each other (S1401), and the measurement signals are classified by determining to which classification group each body motion signal belongs, with reference to classification groups of body motion signals which are set in advance (S1402). The measurement signals classified into the classification groups include a plurality of measurement signals of each phase encoding. Consequently, first, the image creation unit 736 averages the measurement signals included in the classification group for each phase encoding, and performs phase encoding and Fourier transformation of the measurement signals in a time direction, to thereby calculate partially averaged spectroscopic images (S1403). Here, when the partially averaged spectroscopic image is calculated in S1403, missing may occur in phase encoding data. In other words, a classification group that does not include measurement signals of certain phase encoding may be generated. In this case, reconstruction may be performed while estimating a missing portion, or a classification group in which missing having a value equal to or greater than a certain threshold value occurs may be removed.

Subsequently, the correction unit 735 performs frequency correction and/or phase correction for each voxel of partially averaged spectroscopic images of each classification group (S1404). That is, with respect to the corresponding voxels of partially averaged spectroscopic images of each classification group, frequencies and phases are calculated from values of the voxels, and correction is performed so that at least one of the frequencies and the phases of the corresponding voxels become equal to each other. Methods of the frequency correction and the phase correction are the same as the methods described in the first embodiment (for example, methods using Expression (3) and Expression (31) to Expression (33)). This correction is performed on all of the voxels constituting a partially averaged spectroscopic image, and is then completed.

Finally, a synthesis unit 737 performs the weighted-averaging of the partially averaged spectroscopic images corrected in S1404 by using the number of measurement signals of each classification to thereby calculate an integrated spectroscopic image (S1405).

According to this embodiment, it is possible to realize MRSI in which the influence of a frequency fluctuation or a phase fluctuation due to a body motion is reduced by the above-described processing. That is, in this embodiment to which MRSI is applied, since a body motion time phase is different in each phase encoding, classification based on body motion time phases is performed on measurement signals in S1402 before a spectroscopic image is calculated. In S1403, an average of measurement signals of the same phase encoding is obtained for each classification group, and then a spectroscopic image is calculated. These processes are different from those in the first embodiment.

Meanwhile, the above-described contents and procedure are just examples, and various modifications can be made thereto. For example, the flow of FIG. 14 shows a case where frequency correction or phase correction in S1404 is performed for each pixel (voxel) of a spectroscopic image considering that a frequency fluctuation or a phase fluctuation due to a body motion often varies depending on a location. However, for example, a modification, such as the using of a correction value which is spatially smoothed, may be made. Thereby, it is possible to perform appropriate correction even when an SNR is low and it is difficult to perform correction for each pixel.

Figure 15:
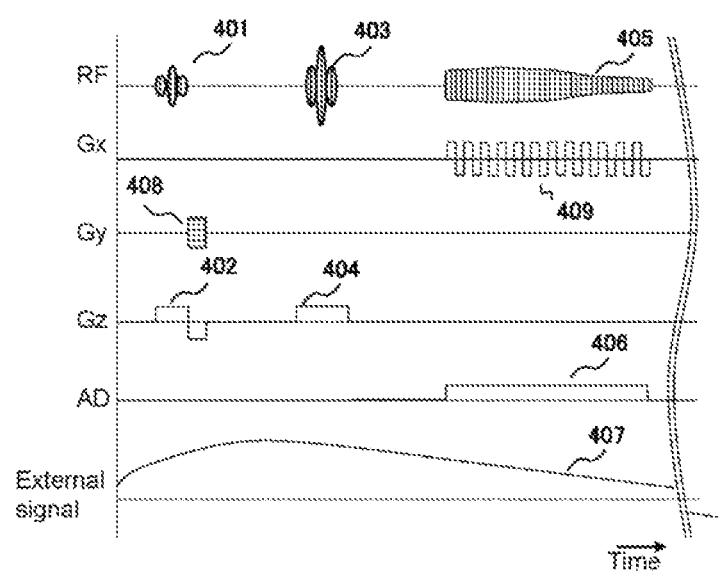
FIG. 15 is a diagram showing another example of the MRSI pulse sequence used in the second embodiment.

In addition, the pulse sequence of FIG. 13 is just an example, and it is needless to say that a pulse sequence of another MRSI measurement may be used. FIG. 15 shows an example of another representative pulse sequence which is used in MRSI measurement. In the pulse sequence of FIG. 13, the phase encoding gradient magnetic field 408 is applied to two axes of an X-axis and a Y-axis. However, in the pulse sequence of FIG. 15, a phase encoding gradient magnetic field is applied to only one axis of a Y-axis, and a vibration gradient magnetic field 409 is applied to an X-axis instead, thereby acquiring spatial information. In the method of FIG. 13, since phase encoding is used for two axes, there is a tendency for missing to occur in k spatial information when classification is performed on the basis of body motion signals in S1403. However, according to this method, phase encoding is used for one axis, and thus there is an advantage in that missing is not likely to occur in k spatial information. Meanwhile, this method is a method using the vibration gradient magnetic field 409. However, for example, a method such as the generation of a multi-echo by repeatedly applying an inverted pulse 403 may be used.

Further, a modification of the measurement method and a modification of the data processing as described in the first embodiment can also be applied to the second embodiment.

Third Embodiment

The first embodiment is an embodiment related to MRS measurement to which the invention is applied, but this embodiment is an embodiment related to DWS measurement to which the invention is applied. That is, in a magnetic resonance measuring apparatus of this embodiment, a measurement unit applies an MPG pulse to an inspection object in one to a plurality of predetermined directions to thereby measure a nuclear magnetic resonance signal from one region or a plurality of regions, and a computational calculation unit calculates a diffusion-weighted spectrum in the one region. At this time, after a phase fluctuation in diffusion-weighted spectra obtained by a plurality of times of measurement is corrected, the diffusion-weighted spectra having been subjected to the correction are integrated.

Figure 16:
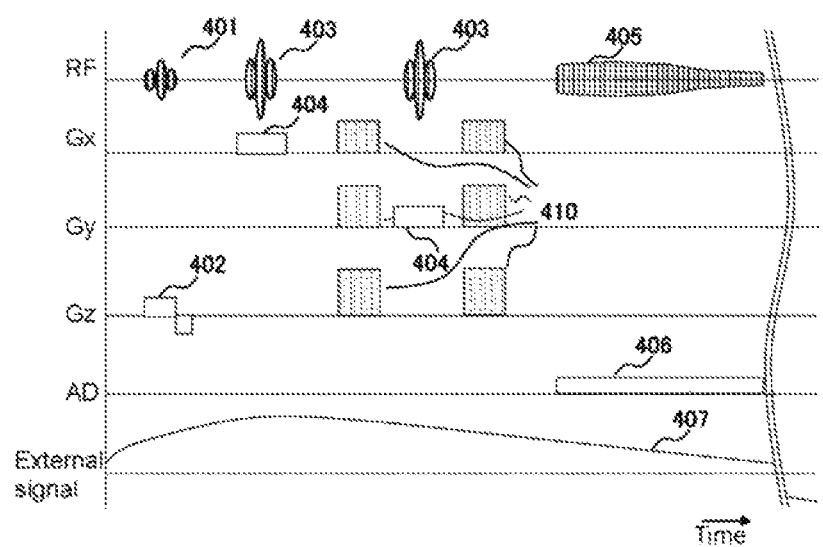
FIG. 16 is a diagram showing an example of a DWS pulse sequence used in a third embodiment.

FIG. 16 shows an example of a representative pulse sequence which is used in DWS measurement, and is different from FIG. 4 in that a diffusion gradient magnetic field 410 is applied. The diffusion gradient magnetic field is constituted by two or more gradient magnetic fields that compensate for each other. In a state where molecular diffusion does not occur, dephasing and rephasing of a phase are set to have the same amount, and thus there is no change in a signal. However, in a case where molecular diffusion occurs, signal attenuation occurs due to the intensity thereof. On the contrary, it is possible to measure molecular diffusion for each metabolite from the signal attenuation. In a case where there is a body motion such as a heartbeat, a phase fluctuation occurs by the application of a diffusion gradient magnetic field. For example, in a case where a uniform motion is performed between two pulses of a diffusion gradient magnetic field, a phase fluctuation occurs due to the speed thereof. For this reason, when a plurality of spectra having different time phases of a heartbeat are simply integrated, an integrated spectrum is attenuated to a degree equal to or greater than a degree of an effect of molecular diffusion due to a difference in phase. For this reason, there is a problem in that the metabolite is analyzed as if the metabolite apparently has a large diffusion coefficient.

Figure 5:
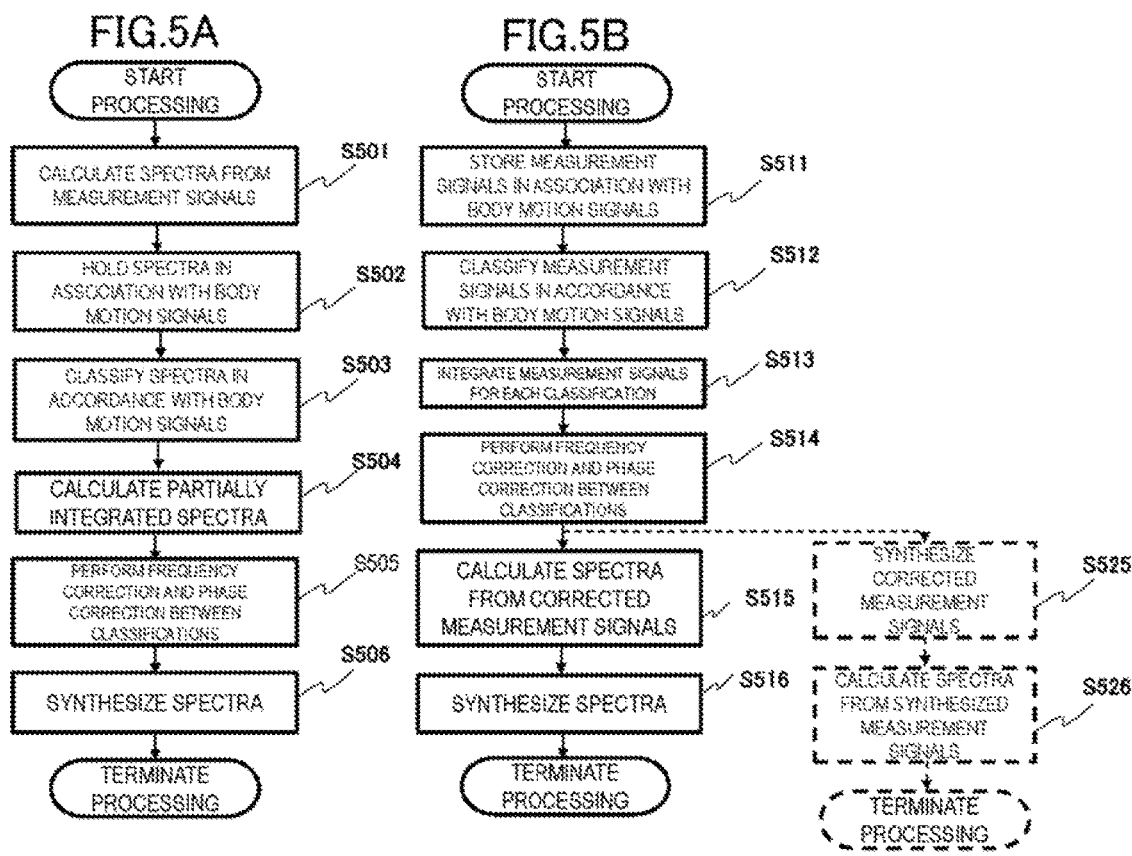
FIGS. 5A and 5B are flow charts showing a flow of data processing according to the first embodiment.
Figure 8:
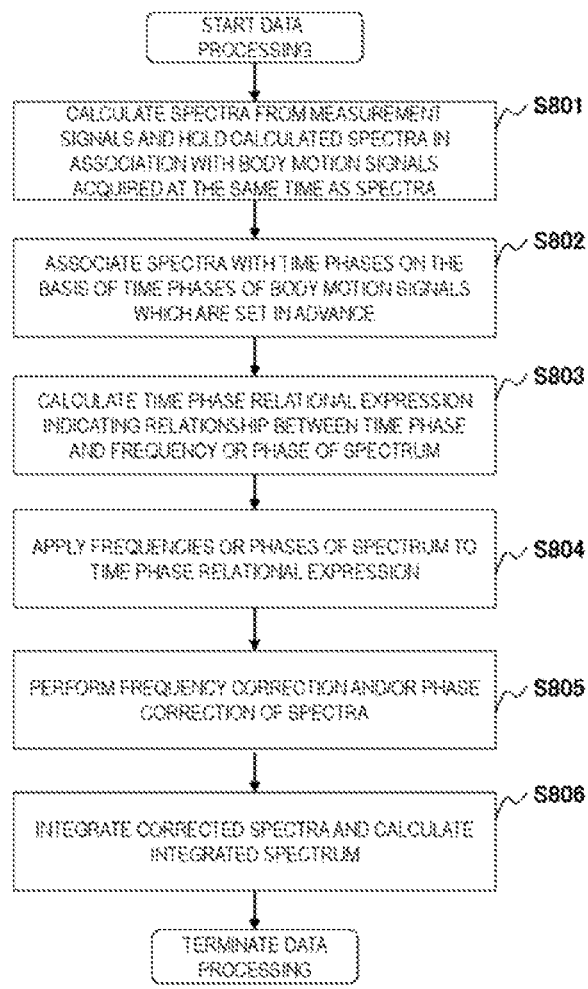
FIG. 8 is a flowchart showing a flow of data processing according to the first modification example.

The data processing in this embodiment for solving such a problem is processing in which spectroscopy is reread as diffusion-weighted spectroscopy in the flow charts shown in FIGS. 5, 8, and 10. The other processes are the same as those in the drawings, and thus a description thereof will not be repeated. However, in DWS, a signal is particularly attenuated due to the application of a diffusion gradient magnetic field, and thus an SNR of each diffusion-weighted spectroscopy tends to be reduced. Therefore, a measure, such as partial integration, for increasing an SNR is effective. In addition, a phase fluctuation mainly affects a signal based on a body motion and the application of a diffusion gradient magnetic field, and thus only phase correction may be performed.

Figure 17:
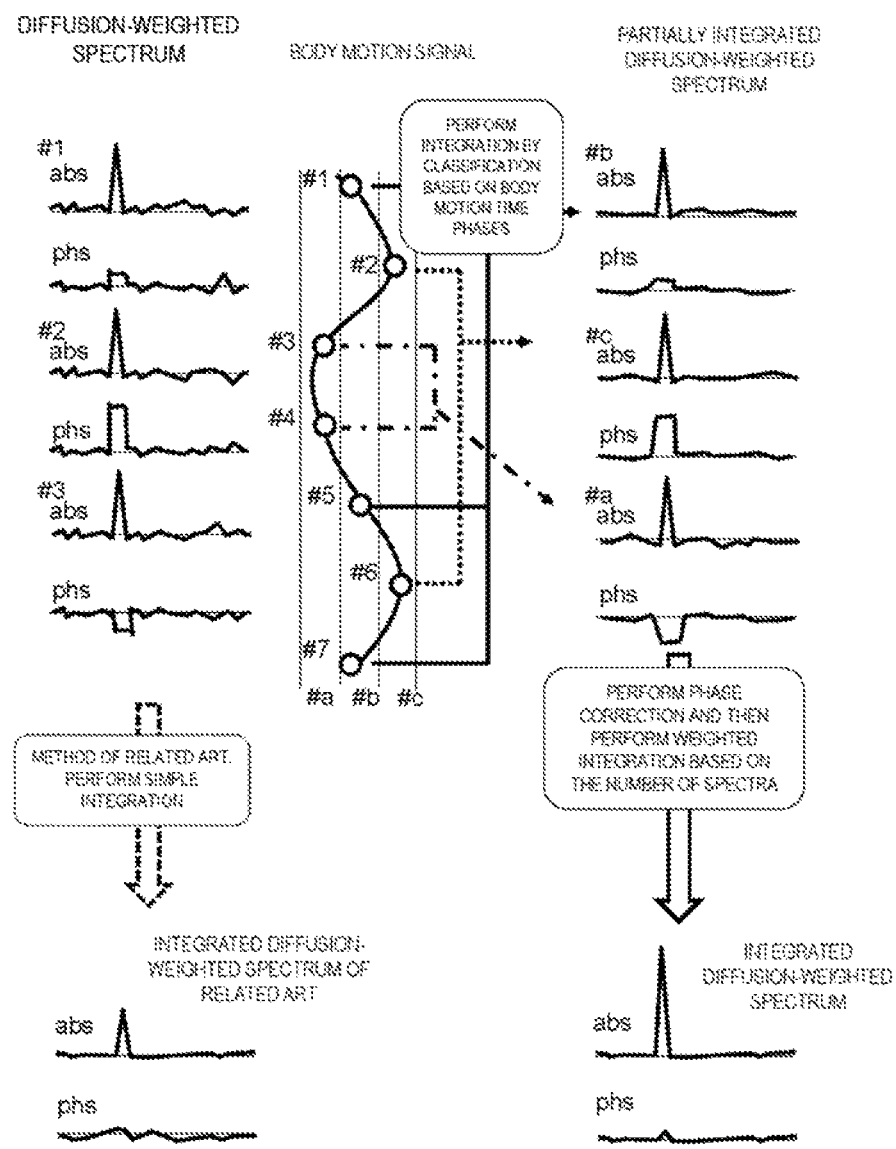
FIG. 17 is a diagram showing a flow and effects of data processing according to the third embodiment.

FIG. 17 schematically shows a problem of integration due to a phase fluctuation and effects of data processing in this embodiment. In the drawing, an absolute value abs and a phase phs are shown with respect to each of diffusion-weighted spectra #1 to #3 obtained in respective measurements. In the diffusion-weighted spectra #1 to #3, the absolute values abs are substantially the same as each other, other than noise components, but the phases phs change depending on a time phase of a body motion signal. When these are simply integrated, an absolute value abs of a spectrum after the integration is reduced due to a difference in phase. On the other hand, in the data processing in this embodiment, spectra are classified based on body motion time phases to calculate partially integrated diffusion-weighted spectra #a to #c, thereby obtaining partially integrated diffusion-weighted spectra in which an SNR is increased in each classification (for example, S503 and S504 of FIG. 5). Subsequently, after phase correction is performed (S505), weighted integration based on the number of times of partial integration of each classification is performed (S506), and thus it is possible to acquire integrated diffusion-weighted spectra in which a signal deterioration due to a phase fluctuation is suppressed.

In this manner, according to this embodiment, it is possible to realize DWS in which the influence of a frequency fluctuation and a phase fluctuation due to a body motion, particularly, a heartbeat is reduced.

In addition, according to this embodiment, it is also possible to obtain an effect that an apparent diffusion coefficient (ADC) can be calculated in DWS with a high level of accuracy. That is, in DWS, a diffusion coefficient of each metabolite may be measured. A diffusion coefficient obtained by measuring a living body is not a pure diffusion coefficient and is restricted by a biological membrane and is influenced by a flow, and thus the diffusion coefficient is called an apparent diffusion coefficient. An ADC is often obtained by fitting signal attenuation in a case where a diffusion gradient magnetic field is not applied or a low diffusion gradient magnetic field is applied and in a case where a high diffusion gradient magnetic field is applied, by using a single exponential function. In a method of the related art, a phase fluctuation due to a body motion and a diffusion gradient magnetic field is reduced when a diffusion gradient magnetic field is not applied or a low diffusion gradient magnetic field is applied, and thus an absolute value of a spectrum is also decreased a little due to integration. However, as a diffusion gradient magnetic field becomes higher, a decrease in an absolute value of a spectrum becomes prominent. For this reason, the method of the related art also has a problem that a large ADC is calculated. However, in the method of this embodiment, a phase fluctuation is corrected by increasing an SNR, and thus it is possible to improve the measurement accuracy of an ADC. Meanwhile, in DWS, an index such as fractional anisotropy (FA) or a kurtosis is also calculated without being limited to an index such as an ADC. Similarly, it is also possible to improve the accuracy of these indexes. Particularly, in a case of a metabolite, molecular diffusion is more restricted in a living body than in a case of a water molecule, and it is important to improve accuracy by a higher level of analysis than fitting using a single exponential function.

Meanwhile, a modification of the measurement method and a modification of the data processing as described in the first embodiment can also be applied to this embodiment. In the above description, a case where a body motion is a heartbeat has been mainly described, but it is also possible to acquire two types of body motion signals of a heartbeat and a breathing motion as body motion signals and to perform partial integration and frequency and phase correction in a stepwise manner.

Figure 18:
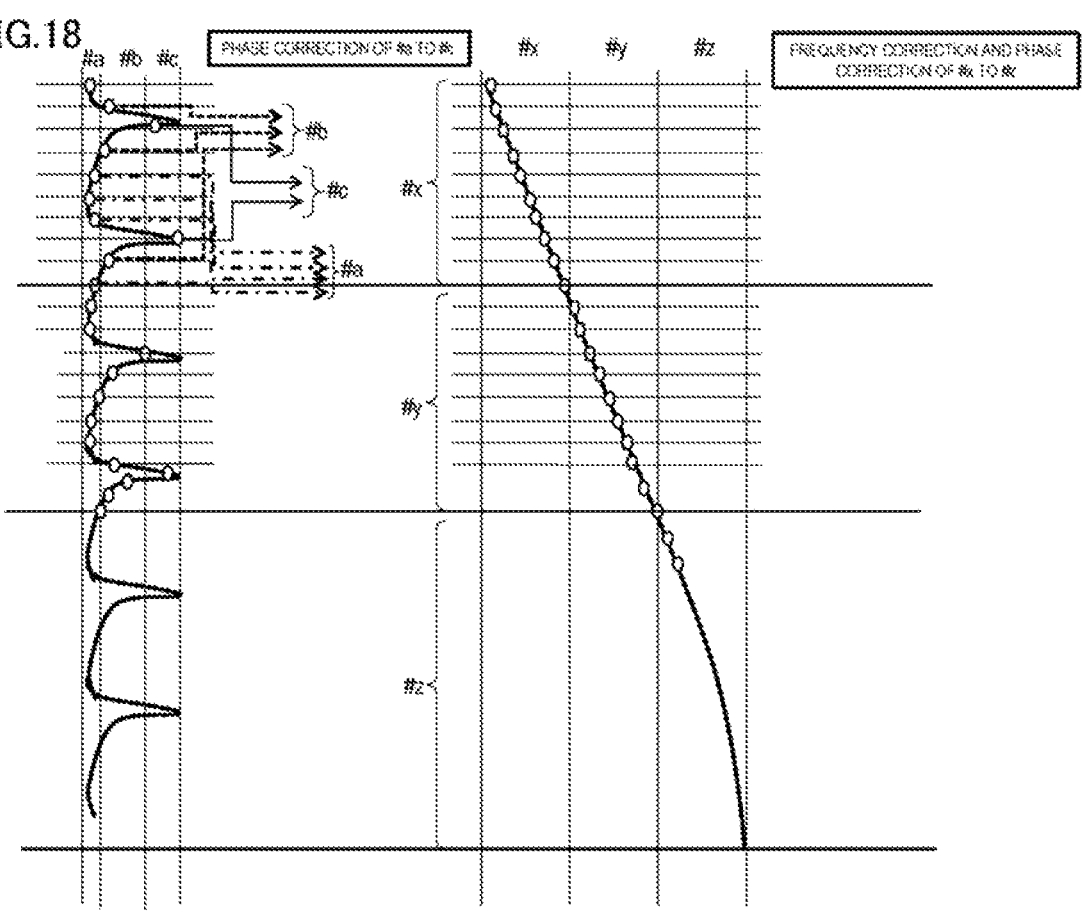
FIG. 18 is a diagram showing a process according to a modification example of the third embodiment.

An example of a classification method in a case where two types of body motion signals are used is schematically shown in FIG. 18. In this example, for example, a body motion signal A indicating a heartbeat is acquired from an electrocardiograph, and a body motion signal X indicating a motion (breathing motion) of a diaphragm is acquired using a navigator echo. Each of the body motion signal A and the body motion signal X is separated into a plurality of classification groups by a predetermined classification method. In the drawing, three classification groups are shown in order to simplify a description, but the number of classification groups of each of the signals is arbitrary.

A mark ○ on each body motion signal indicates a measurement signal or a spectrum. First, spectra are classified on the basis of a body motion time phase of a breathing motion, and are then classified on the basis of a body motion time phase of a heartbeat for each classification group of the breathing motion. First partially integrated diffusion-weighted spectra #a, #b, and #c are calculated with respect to a classification group of a heartbeat, and phase correction is performed so that phases conform to each other between the partially integrated spectra. Weighted integration is performed on the corrected partially integrated diffusion-weighted spectra, to thereby obtain second partially integrated diffusion-weighted spectra #x, #y, and #z for each classification group of body motion time phases of breathing motions. Subsequently, phase correction is performed so that frequencies and/or phases conform to each other between the second partially integrated diffusion-weighted spectra #x, #y, and #z.

Finally, the corrected second partially integrated diffusion-weighted spectra are synthesized to thereby obtain an integrated diffusion-weighted spectrum.

By such processing, it is possible to exclude the influence of a frequency fluctuation and a phase fluctuation with respect to both body motions of a heart rate and breathing and to realize DWS with a higher level of accuracy. Meanwhile, correction using a plurality of body motion signals can also be applied not only to DWS but also to the first embodiment (MRS) and the second embodiment (MRSI) which are described above, and a fourth embodiment (DWSI) to be described below.

Fourth Embodiment

The second embodiment is an embodiment related to MRSI measurement to which the invention is applied, but this embodiment is an embodiment related to DWSI measurement to which the invention is applied. Processing in this embodiment is processing in which a spectroscopic image is reread as a diffusion-weighted spectroscopic image in the processing (FIG. 14) in the second embodiment. That is, in a magnetic resonance measuring apparatus of this embodiment, a measurement unit applies an MPG pulse to an inspection object in one to a plurality of predetermined directions to thereby measure a nuclear magnetic resonance signal from a plurality of regions included in a cross section of the inspection object, and a computational calculation unit includes an image creation unit that creates an image for each molecule or each nuclide included in the cross section, in addition to the components of the third embodiment.

Similar to the second embodiment, the image creation unit calculates partially averaged spectroscopic images for each classification based on body motion signals, and the computational calculation unit applies at least one of phase correction and frequency correction to the partially averaged spectroscopic images and then integrates the partially averaged spectroscopic images having been subjected to the correction.

Figure 19:
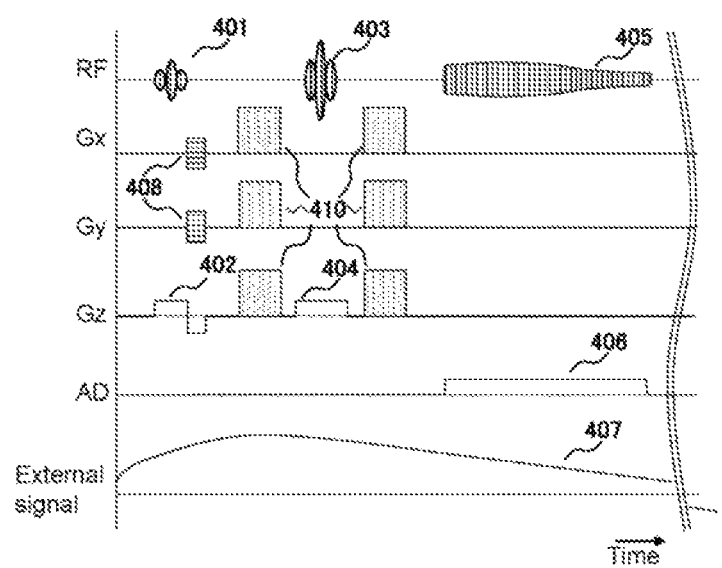
FIG. 19 is a diagram showing an example of a DWSI pulse sequence used in a fourth embodiment.

FIG. 19 shows an example of a representative pulse sequence which is used in DWSI measurement. The pulse sequence of FIG. 19 is different from the pulse sequence shown in FIG. 13 in that a diffusion gradient magnetic field 410 is applied. As described in the third embodiment, also in DWSI, a signal deterioration of a spectrum occurs in an integrated diffusion-weighted spectroscopic image in a method of the related art due to the influence of a body motion and a diffusion gradient magnetic field, and thus there is a problem in that a metabolite is analyzed as if the metabolite has a high ADC in a portion with a strong body motion. In this embodiment, frequency correction or phase correction is performed on a magnetic resonance signal (measurement signal) which is obtained by DWSI measurement on the basis of measurement signals and body motion signals, thereby suppressing signal deterioration due to a body motion.

Hereinafter, an outline of processing in this embodiment will be described with reference to FIG. 14. Similar to the second embodiment, measurement signals acquired in respective measurements and body motion signals acquired at the same time as the measurement signals are held in association with each other (S1401), and the measurement signals are classified by determining to which classification group each body motion signal belongs, with reference to classification groups of body motion signals which are set in advance (S1402). Subsequently, measurement signals included in a classification group are averaged for each phase encoding, and phase encoding and Fourier transformation of the measurement signals in a time direction are performed, thereby calculating partially averaged diffusion-weighted spectroscopic images (S1403). Frequency correction and/or phase correction are performed for each voxel of partially averaged diffusion-weighted spectroscopic images of each classification group (S1404). Finally, the weighted-averaging of the corrected partially averaged diffusion-weighted spectroscopic images is performed using the number of measurement signals of each classification, thereby calculating an integrated diffusion-weighted spectroscopic image (S1405). In this manner, it is possible to realize DWSI in which the influence of a frequency fluctuation or a phase fluctuation due to a body motion is reduced.

Even in this embodiment, a measure, such as partial integration, for increasing an SNR is effective. In addition, a phase fluctuation mainly affects a signal based on a body motion and the application of a diffusion gradient magnetic field, and thus only phase correction may be performed in S1404.

Figure 20:
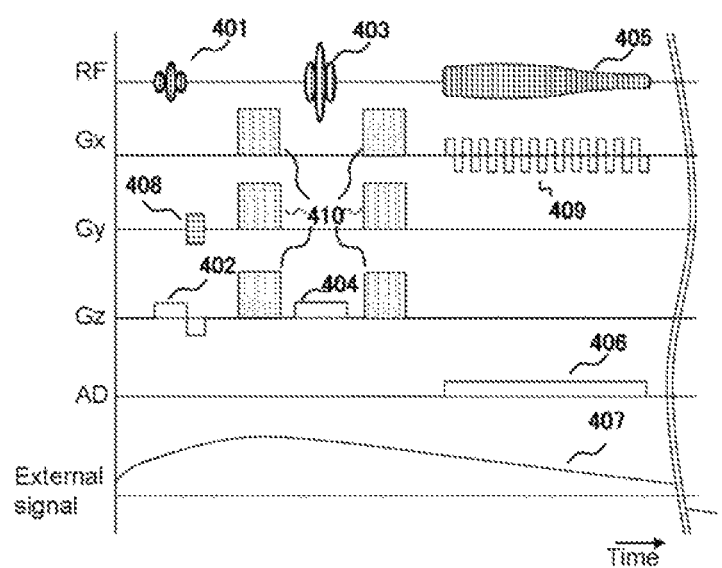
FIG. 20 is a diagram showing another example of the DWSI pulse sequence used in the fourth embodiment.

A modification of the measurement method and a modification of the data processing as described in the first embodiment can also be applied to this embodiment. In addition, another pulse sequence as shown in FIG. 20 may be used as a pulse sequence of DWSI measurement. The pulse sequence shown in FIG. 20 is different from the pulse sequence of FIG. 18 in that a vibration gradient magnetic field 409 is applied to an X-axis instead of applying a phase encoding gradient magnetic field 408 to two axes of an X-axis and a Y-axis. It is possible to suppress the missing of k spatial information when classification is performed in S1402 by using the pulse sequence of FIG. 20, as described in the second embodiment.

According to the above-described embodiments, it is possible to acquire an integrated spectrum in which the influence of a frequency fluctuation or a phase fluctuation of a spectrum due to a body motion (for example, a breathing motion or a heartbeat) is reduced. In particular, in MRS and MRSI, it is possible to suppress a frequency fluctuation caused by a static magnetic field fluctuation due to a breathing motion and to suppress a deterioration in the intensity and an increase in the width of a spectrum. In addition, in DWI and DWSI, it is possible to suppress a phase fluctuation of a diffusion-weighted spectrum due to a heartbeat and to suppress a deterioration in the intensity of a spectrum during integration. In addition, it is possible to realize DWI and DWSI in which both a breathing motion and a heartbeat can suppress influence.

As described above, the magnetic resonance measuring apparatus according to the embodiments of the invention have been described, but the invention is not limited thereto. For example, in the above-described embodiment, a case where the invention is realized by an MRI apparatus has been described. However, the invention can also be applied to a magnetic resonance measuring apparatus that does not have a function of creating a tomographic image, and can also be realized by an image processing apparatus which is an apparatus different from an imaging apparatus or a measuring apparatus.

What is claimed is:

1. A magnetic resonance measuring apparatus comprising:
a measurement unit that measures nuclear magnetic resonance signals emitted from an inspection object;
a computational calculation unit that calculates spectrum information corresponding to molecules or nuclei included in the inspection object, by using the nuclear magnetic resonance signals measured by the measurement unit; and
a body motion information recording unit that records measurement signals, measured by the measurement unit, in association with body motion signals indicating periodic movement of the inspection object during the measurement of the measurement signals,
wherein the computational calculation unit includes
a spectrum calculation unit that calculates spectra based on the nuclear magnetic resonance signals,
a correction unit that corrects the measurement signals or the spectra, on the basis of a relationship between the periodic movement and a phase fluctuation and/or a frequency fluctuation of the spectra,
a synthesis unit that synthesizes the measurement signals or the spectra corrected by the correction unit,
a classification unit that classifies the measurement signals or the spectra in accordance with the body motion signals during the measurement of the measurement signals, and
a partially integrating unit that integrates the measurement signals or the spectra classified by the classification unit, for each classification group, and
wherein the correction unit corrects phases and/or frequencies with respect to each spectrum calculated from integrated measurement signals or spectra, integrated by the partially integrating unit.

2. The magnetic resonance measuring apparatus according to claim 1,
wherein the computational calculation unit calculates a time phase relational expression between the periodic movement and the phase fluctuation and/or the frequency fluctuation of the spectra, and
wherein the correction unit corrects the spectra using the time phase relational expression.

3. The magnetic resonance measuring apparatus according to claim 1,
wherein the body motion information recording unit records a signal applied from a body motion detection apparatus mounted to the inspection object as a body motion signal.

4. The magnetic resonance measuring apparatus according to claim 1,
wherein the measurement unit measures a navigation echo, apart from a measurement signal for obtaining the spectrum information, and
wherein the computational calculation unit detects body motion information using the navigation echo, and transmits the detected body motion information to the body motion information recording unit.

5. The magnetic resonance measuring apparatus according to claim 1,
wherein the body motion information recording unit records a body motion signal of a breathing motion or a heartbeat as the periodic movement.

6. The magnetic resonance measuring apparatus according to claim 1,
wherein the measurement unit performs first measurement in which a signal from a water proton is not suppressed, and second measurement in which a signal from a water proton is suppressed, and
wherein the correction unit calculates a correction value for correcting the spectra by using measurement data obtained by the first measurement, and performs correction on measurement data obtained by the second measurement by using the correction value.

7. The magnetic resonance measuring apparatus according to claim 1,
wherein the measurement unit measures nuclear magnetic resonance signals from one or more regions of the inspection object, and
wherein the computational calculation unit calculates metabolite spectra of the or more regions.

8. The magnetic resonance measuring apparatus according to claim 1,
wherein the measurement unit measures nuclear magnetic resonance signals from a plurality of regions included in a cross section of the inspection object, and
wherein the computational calculation unit creates metabolite distribution of the cross section.

9. The magnetic resonance measuring apparatus according to claim 1,
wherein the measurement unit applies an MPG pulse to the inspection object in one or more predetermined directions to thereby measure the nuclear magnetic resonance signals from one or more regions, and
wherein the computational calculation unit calculates diffusion-weighted spectra of metabolites included in the one or more regions.

10. The magnetic resonance measuring apparatus according to claim 1,
wherein the measurement unit applies an MPG pulse to the inspection object in one or more predetermined directions to thereby measure the nuclear magnetic resonance signals from a plurality of regions included in a cross section of the inspection object, and
wherein the computational calculation unit creates spatial distribution of molecular diffusion of metabolites included in the cross section.

11. The magnetic resonance measuring apparatus according to claim 1, wherein the computational calculation unit synthesizes each corrected partially integrated spectrum amongst the one or more spectra corrected by the correction unit, into a synthesized spectrum.

12. An image processing method of generating a spectrum or a spectroscopic image of a measurement object by using measurement data measured by a magnetic resonance measuring apparatus, the image processing method comprising:
- (a) recording measurement data in association with a periodic motion of the measurement object during the measurement of the measurement data;
- (b) correcting at least one of a phase fluctuation and a frequency fluctuation included in the measurement data on the basis of a relationship between the periodic motion and the phase fluctuation or the frequency fluctuation;
- (c) calculating a spectrum by using the corrected measurement data;
- (c1) classifying the measurement data or spectra in accordance with the periodic motion during the measurement of the measurement data;
- (c2) integrating the measurement data or the spectra classified in (c1), for each classification group; and
- (c3) correcting phases and/or frequencies with respect to each spectrum calculated from integrated measurement signals or spectra, integrated in (c2).

13. An image processing method of generating a spectrum or a spectroscopic image of a measurement object by using measurement data measured by a magnetic resonance measuring apparatus, the image processing method comprising:
- (a) recording measurement data in association with a periodic motion of the measurement object during the measurement of the measurement data;
- (b) correcting at least one of a phase fluctuation and a frequency fluctuation included in spectra calculated from the measurement data, on the basis of a relationship between the periodic motion and the phase fluctuation or the frequency fluctuation;
- (c1) classifying the measurement data or the spectra in accordance with the periodic motion during the measurement of the measurement data;
- (c2) integrating the measurement data or the spectra classified in (c1), for each classification group; and
- (c3) correcting phases and/or frequencies with respect to each spectrum calculated from integrated measurement data or spectra, integrated in (c2).

14. The image processing method according to claim 13, further comprising:
- classifying the spectra calculated from the measurement data in accordance with a time phase of the periodic motion;
- integrating the classified spectra for each classification to thereby create partially integrated spectra;
- performing correction based on the relationship between the periodic motion and the phase fluctuation or the frequency fluctuation on the partially integrated spectra; and
- synthesizing the corrected partially integrated spectra.

15. The image processing method according to claim 13, further comprising:
- calculating a relational expression between at least one of a phase fluctuation and a frequency fluctuation included in the spectrum and a time phase of the periodic motion; and
- correcting at least one of the phase fluctuation and the frequency fluctuation in accordance with the relational expression.

* * * * *